United States Patent
Tomita et al.

(10) Patent No.: US 10,971,619 B2
(45) Date of Patent: Apr. 6, 2021

(54) SEMICONDUCTOR DEVICE AND MANUFACTURING METHOD OF THE SAME

(71) Applicant: DENSO CORPORATION, Kariya (JP)

(72) Inventors: Hidemoto Tomita, Toyota (JP); Tomohiko Mori, Nagakute (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/502,492

(22) Filed: Jul. 3, 2019

(65) Prior Publication Data
US 2020/0052104 A1    Feb. 13, 2020

(30) Foreign Application Priority Data

Aug. 8, 2018  (JP) .............................. JP2018-149720

(51) Int. Cl.
*H01L 29/78*  (2006.01)
*H01L 29/10*  (2006.01)
(Continued)

(52) U.S. Cl.
CPC ...... *H01L 29/7802* (2013.01); *H01L 21/0254* (2013.01); *H01L 21/0274* (2013.01);
(Continued)

(58) Field of Classification Search
CPC ......... H01L 27/14679; H01L 29/66431; H01L 29/66462; H01L 29/66893; H01L 29/66924; H01L 29/7832; H01L 29/8086; H01L 2924/13062; H01L 29/1058; H01L 29/1066; H01L 27/098
See application file for complete search history.

(56) References Cited

U.S. PATENT DOCUMENTS 10,374,075 B2 *  8/2019  Tominaga ........... H01L 29/7811
2013/0001703 A1 *  1/2013  Sugawara ........... H01L 29/0657
257/378
(Continued)

FOREIGN PATENT DOCUMENTS

WO    2016/143099 A1    9/2016

OTHER PUBLICATIONS

Ueno, K., "Development of Normally-Off MOSFET on Homoepitaxial GaN;" Oyo Butsuri; 2017; pp. 376-380; vol. 86; No. 5.

*Primary Examiner* — Jonathan Han
(74) *Attorney, Agent, or Firm* — Oliff PLC

(57) ABSTRACT

A semiconductor device may include a semiconductor layer; a source electrode disposed above one main surface of the semiconductor layer; a drain electrode disposed below another main surface of the semiconductor layer; and an insulation gate section. The semiconductor layer may include a drift region of a first conductivity type; a JFET region of the first conductivity type disposed above the drift region; a body region of a second conductivity type disposed above the drift region and adjoining the JFET region; and a source region of the first conductivity type separated from the JFET region by the body region. The insulation gate section may be opposed to a portion of the body region that separates the JFET region and the source region, a space may be provided within the semiconductor layer, and the drift region, the JFET region and the body region may be exposed to the space.

7 Claims, 30 Drawing Sheets

(51) Int. Cl.
*H01L 21/02* (2006.01)
*H01L 29/36* (2006.01)
*H01L 21/306* (2006.01)
*H01L 21/027* (2006.01)
*H01L 21/311* (2006.01)
*H01L 29/08* (2006.01)
*H01L 29/66* (2006.01)
*H01L 29/417* (2006.01)
*H01L 29/20* (2006.01)
*H01L 29/49* (2006.01)

(52) U.S. Cl.
CPC .. *H01L 21/02164* (2013.01); *H01L 21/02389* (2013.01); *H01L 21/02634* (2013.01); *H01L 21/30625* (2013.01); *H01L 21/31111* (2013.01); *H01L 29/086* (2013.01); *H01L 29/0865* (2013.01); *H01L 29/0878* (2013.01); *H01L 29/1083* (2013.01); *H01L 29/1095* (2013.01); *H01L 29/2003* (2013.01); *H01L 29/36* (2013.01); *H01L 29/41741* (2013.01); *H01L 29/4916* (2013.01); *H01L 29/66522* (2013.01); *H01L 29/66712* (2013.01)

(56) References Cited

U.S. PATENT DOCUMENTS

| | | | |
|---|---|---|---|
| 2014/0210008 A1* | 7/2014 | Oritsuki | H01L 29/0619 257/362 |
| 2015/0084063 A1* | 3/2015 | Van Brunt | H01L 29/6606 257/77 |
| 2015/0097226 A1* | 4/2015 | Lichtenwalner | H01L 29/66333 257/329 |
| 2015/0162432 A1* | 6/2015 | Kumagai | H01L 29/7802 257/77 |

\* cited by examiner

SEMICONDUCTOR DEVICE AND MANUFACTURING METHOD OF THE SAME

CROSS-REFERENCE

This application claims priority to Japanese Patent Application No. 2018-149720 filed on Aug. 8, 2018, the contents of which are hereby incorporated by reference into the present application.

TECHNICAL FIELD

A technique disclosed herein relates to a semiconductor device and a manufacturing method of the same.

BACKGROUND

"Development of Normally-Off MOSFET on Homoepitaxial GaN" OYO BUTSURI, Vol. 86, No. 5, p. 376 (2017) describes a vertical semiconductor including a semiconductor layer, a source electrode disposed above one main surface of the semiconductor layer, and a drain electrode disposed below another main surface of the semiconductor layer. The semiconductor layer includes an n-type drift region, an n-type JFET region disposed above the drift region, and a p-type body region disposed above the drift region and adjoining the JFET region.

As pointed out in International Publication No. WO 2016/143099, it is known that in such a semiconductor device, electric field concentrates at a corner of a body region, that is, at a portion where three regions, namely a drift region, a JFET region, and the body region, are in contact. In this type of semiconductor device, a technique that suppresses dielectric breakdown at such a portion where electric field concentrates is demanded.

SUMMARY

A semiconductor device disclosed herein may comprise a semiconductor layer; a source electrode disposed above one main surface of the semiconductor layer; a drain electrode disposed below another main surface of the semiconductor layer; and an insulation gate section. The semiconductor layer may comprise a drift region of a first conductivity type; a JFET region of the first conductivity type disposed above the drift region; a body region of a second conductivity type disposed above the drift region and adjoining the JFET region; and a source region of the first conductivity type separated from the JFET region by the body region. The insulation gate section may be opposed to a portion of the body region that separates the JFET region and the source region. A space may be provided within the semiconductor layer. The drift region, the JFET region and the body region may be exposed to the space. In this semiconductor device, the space is provided so as to correspond to a portion where electric field concentrates. Since the space has high dielectric strength, dielectric breakdown at the portion where electric field concentrates can be suppressed.

A manufacturing method of a semiconductor device disclosed herein may comprise: providing a first semiconductor layer, wherein a JFET region of a first conductivity type and a body region of a second conductivity type adjoin at one main surface side of the first semiconductor layer; removing a part of the first semiconductor layer from another main surface side of the first semiconductor layer such that the JFET region and the body region are exposed; forming a recess in a surface that has appeared by removing the part of the first semiconductor layer, wherein the JFET region and the body region are exposed to the recess; providing a space by forming a drift region of the first conductivity type to cover the recess, wherein the drift region, the JFET region and the body region are exposed to the space. In this manufacturing method of the semiconductor device, the space can be provided so as to correspond to a portion where electric field concentrates.

DETAILED DESCRIPTION

Representative, non-limiting examples of the present disclosure will now be described in further detail with reference to the attached drawings. This detailed description is merely intended to teach a person of skill in the art further details for practicing preferred aspects of the present teachings and is not intended to limit the scope of the present disclosure. Furthermore, each of the additional features and teachings disclosed below may be utilized separately or in conjunction with other features and teachings to provide improved semiconductor devices, as well as methods for using and manufacturing the same.

Moreover, combinations of features and steps disclosed in the following detailed description may not be necessary to practice the present disclosure in the broadest sense, and are instead taught merely to particularly describe representative examples of the present disclosure. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

With reference to the drawings, a semiconductor device and a manufacturing method of the same will be described. Hereinbelow, components that are substantially common among embodiments and variants will be given identical reference signs, and explanations thereof may not be described.

(Semiconductor Device of First Embodiment)

Figure 1:
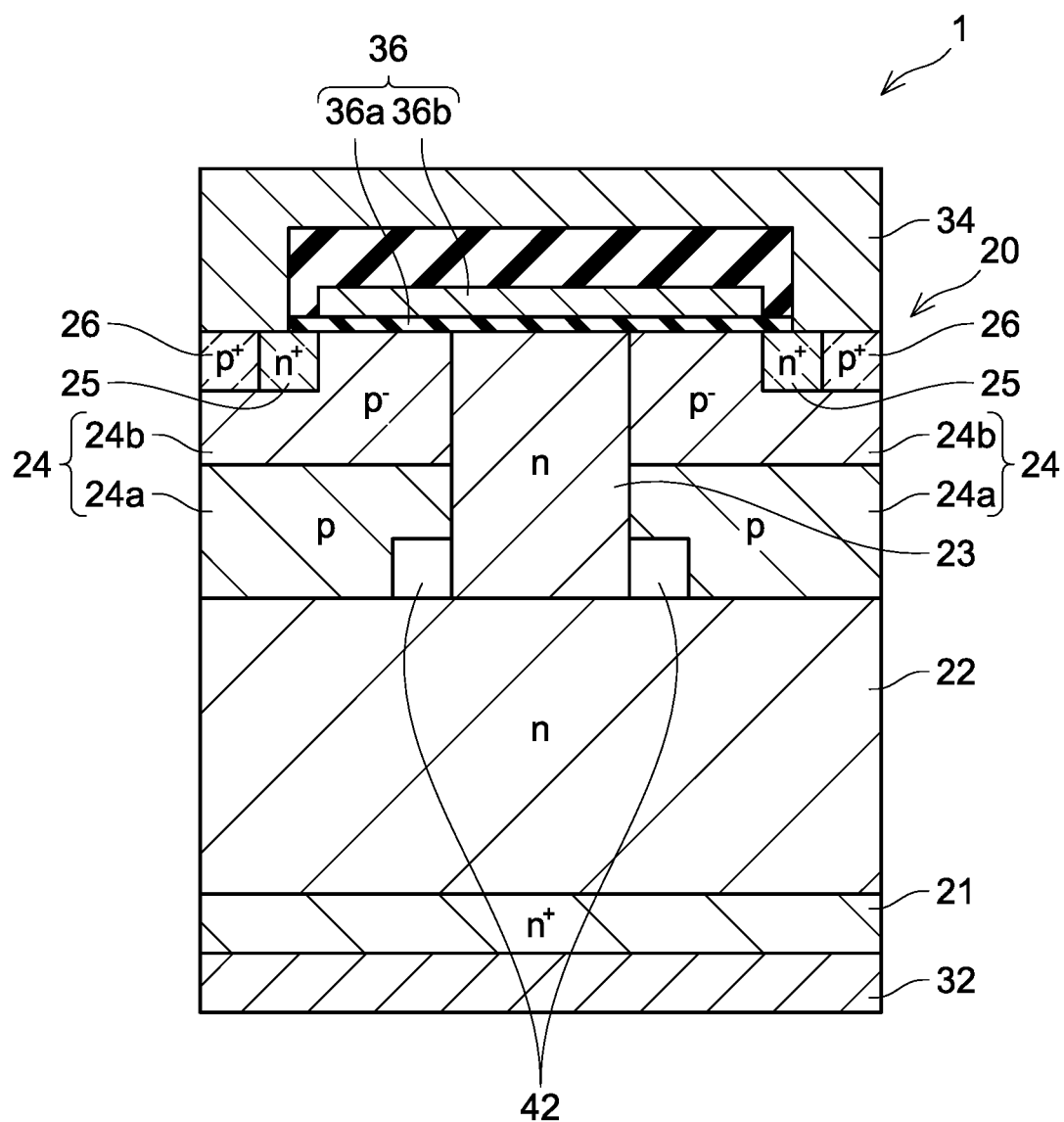
FIG. 1 schematically shows a cross sectional view of a main part of a semiconductor device in one embodiment.

FIG. 1 schematically shows a cross sectional view of a main part of a semiconductor device 1 of a first embodiment. The semiconductor device 1 comprises a nitride semiconductor layer 20, a drain electrode 32 covering a rear surface of the nitride semiconductor layer 20, a source electrode 34 covering a front surface of the nitride semiconductor layer 20, and an insulation gate section 36 provided on a part of the front surface of the nitride semiconductor layer 20. The nitride semiconductor layer 20 comprises an $n^+$-type drain region 21, an n-type drift region 22, an n-type JFET region 23, a p-type body region 24, $n^+$-type source regions 25 and $p^+$-type body contact regions 26.

The drain region 21 is located at the rear surface of the nitride semiconductor layer 20 and is in ohmic contact with the drain electrode 32. The drain region 21 is constituted of gallium nitride (GaN) containing n-type impurities.

The drift region 22 is disposed on the drain region 21. The drift region 22 is located between the drain region 21 and the JFET region 23, and also is located between the drain region 21 and the body region 24. As described below, the drift region 22 is bonded to rear surfaces of the JFET region 23 and the body region 24 by using a bonding technique. The drift region 22 is constituted of gallium nitride (GaN) containing n-type impurities.

The JFET region 23 is disposed on the drift region 22 and extends from a front surface of the drift region 22 to the front surface of the nitride semiconductor layer 20 along a thickness direction. The JFET region 23 has a convex shape projecting from the front surface of the drift region 22. In other words, the JFET region 23 extends from the front surface of the nitride semiconductor layer 20 to the drift region 22 by penetrating the body region 24. The JFET region 23 is constituted of gallium nitride (GaN) containing n-type impurities. In this embodiment, an impurity concentration of the JFET region 23 is same as an impurity concentration of the drift region 22.

The body region 24 is disposed on the drift region 22 and adjoins a side surface of the JFET region 23. The body region 24 comprises a high concentration body region 24a and a low concentration body region 24b. The body region 24 is constituted of gallium nitride (GaN) containing p-type impurities.

The high concentration body region 24a is disposed between the drift region 22 and the low concentration body region 24b, and contacts the side surface of the JFET region 22 at a lower side thereof. The high concentration body region 24a contains p-type impurities in higher concentration than the low concentration body region 24b, and is provided to suppress the low concentration body region 24b from being punched through when the semiconductor device 1 is off.

The low concentration body region 24b is disposed on the high concentration body region 24a, is located at the front surface of the nitride semiconductor layer 20, and contacts the side surface of the JFET region 23 at an upper side thereof. An impurity concentration of the low concentration body region 24b is adjusted to realize an intended gate threshold voltage.

The source regions 25 are disposed on the low concentration body region 24b, are located at the front surface of the nitride semiconductor layer 20, and is separated from the JFET region 23 by the low concentration body region 24b. The source regions 25 are constituted of gallium nitride (GaN) containing n-type impurities. The source regions 25 are in ohmic contact with the source electrode 34.

The body contact regions 26 are disposed on the low concentration body region 24b and are located at the front surface of the nitride semiconductor layer 20. The body contact region 26 are constituted of gallium nitride (GaN) containing p-type impurities. The body contact region 26 are in ohmic contact with the source electrode 34.

The insulation gate section 36 is provided on a part of the front surface of the nitride semiconductor layer 20, and comprises a gate insulation film 36a constituted of oxide silicon and a gate electrode 36b constituted of polysilicon. The gate electrode 36b is opposed to, via the gate insulation film 36a, the JFET region 23 and portions of the low concentration body region 24b that separate the source regions 25 from the JFET region 23.

In the semiconductor device 1, spaces 42 in a vacuum state are provided within the nitride semiconductor layer 20. A degree of vacuum of the spaces 42 is, for example, about 10 Pa or less, or about 8 Pa or less. However, the degree of vacuum of the spaces 42 may simply be a degree of vacuum that is created as a result of a semiconductor process (especially, the bonding technique). In this embodiment, each of the spaces 42 is located at a portion within an area where the body region 24 exists as viewed in a direction orthogonal to the front surface of the nitride semiconductor layer 20. Each of the spaces 42 is provided to correspond to a portion where a bonded interface between the drift region 22 and the JFET region 23, a bonded interface between the drift region 22 and the high concentration body region 24a, and a bonded interface between the JFET region 23 and the high concentration body region 24a intersect each other. Inner surfaces of the spaces 42 are defined by the drift region 22, the JFET region 23, and the high concentration body region 24a. More specifically, the spaces 42 are provided by removing parts of the high concentration body region 24a that are on a drift region 22 side and on a JFET region 23 side. As above, the drift region 22, the JFET region 23, and the high concentration body region 24a are exposed to the spaces 42.

Next, an operation of the semiconductor device 1 will be described. When the semiconductor device 1 is used, a positive voltage is applied to the drain electrode 32 and the source electrode 34 is grounded. When a positive voltage higher than a gate threshold voltage is applied to the gate electrode 36b, inversion layers are formed in the portions of the low concentration region 24b that separate the JFET region 23 and the source regions 25, and the semiconductor device 1 is turned on. At this occasion, electrons flow into the JFET region 23 from the source regions 25 through the inversion layers. The electrons that have flown into the JFET region 23 flow through the JFET region 23 in a vertical direction toward the drain electrode 32. Due to this, the drain electrode 32 and the source electrode 34 are electrically connected.

Upon when the gate electrode 36b is grounded, the inversion layers disappear and the semiconductor device 1 is turned off. At this occasion, depletion layers start to extend from the high concentration body region 24a and the low concentration body region 24b into the JFET region 23. The JFET region 23 turns into a pinch-off state where the depletion layers extending from its both sides connect to each other. Due to the JFET region 23 being pinched off, electric field applied to the gate insulation film 36a of the insulation gate section 36 is alleviated, and dielectric breakdown of the gate insulation film 36a is suppressed.

Further, the semiconductor device 1 is characterized in that the spaces 42 are provided within the nitride semiconductor layer 20. When such spaces 42 are not provided, electric field concentrates at corners of the high concentration body region 24a, that is, at portions where the three regions, namely the drift region 22, the JFET region 23, and the high concentration body region 24a, are in contact, as described earlier in the description for background. In the semiconductor device 1, the spaces 42 in the vacuum state are provided corresponding to such portions where the electric field concentrates. Since the vacuum has high dielectric strength, dielectric breakdown at such portions where the electric field concentrates is suppressed.

As described above, in the semiconductor device 1, dielectric breakdown at the corners of the high concentration body region 24a is suppressed by the spaces 42. Due to this, a desired breakdown voltage can be ensured even if a drift resistance is set low by adjusting the impurity concentration in the drift region 22 to be high. As above, the semiconductor device 1 can improve a tradeoff relationship between the breakdown voltage and an on-resistance.

Further, as viewed in the direction orthogonal to the front surface of the nitride semiconductor layer 20, the spaces 42 are located at portions within the area where the body region 24 exists. In other words, the spaces 42 are provided at positions where they do not interfere with a current path in the JFET region 23. Due to this, in the semiconductor device 1, an increase in the on-resistance is suppressed, despite the spaces 42 being provided.

Instead of providing the spaces 42 in the vacuum state, disposing insulators in the corresponding regions may be considered. However, disposing insulators may cause a problem that heat is confined. On the other hand, the spaces 42 in the vacuum state can avoid such a problem by their high heat insulating effect. In this regard as well, the technique of providing the spaces 42 in the vacuum state is useful.

(Method of Manufacturing Semiconductor Device of First Embodiment)

Figure 2A:
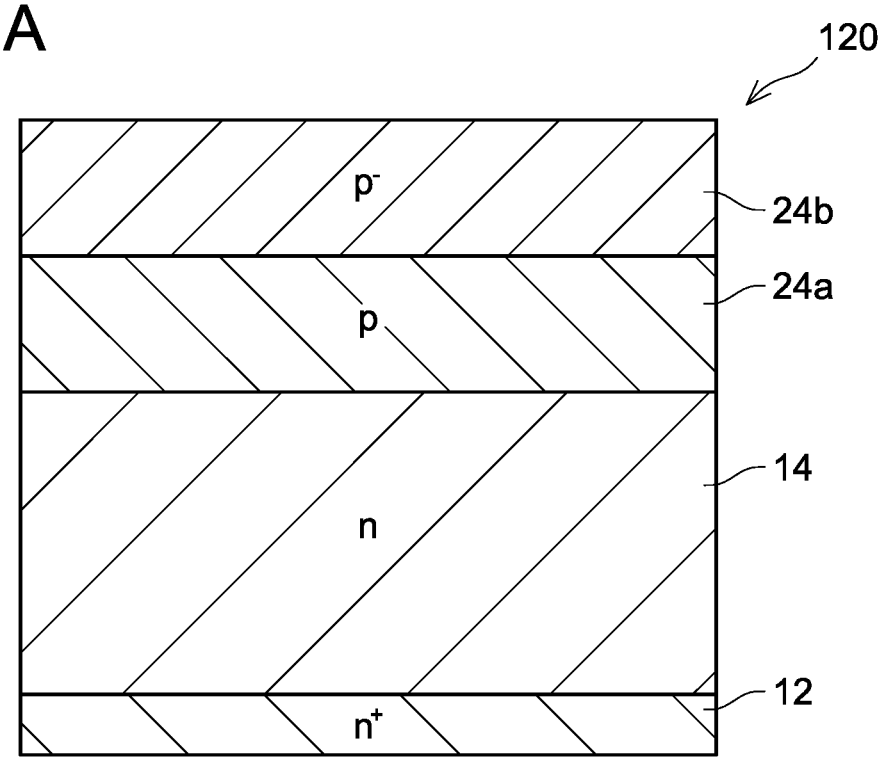
FIG. 2A schematically shows cross sectional views of the main part of the semiconductor device of FIG. 1 in a manufacturing process.

Next, a method of manufacturing the semiconductor device 1 will be described. Firstly, as shown in FIG. 2A, an n-type nitride semiconductor layer 14 of n-type GaN, the high concentration body region 24a of p-type GaN, and the low concentration body region 24b of p-type GaN are layered in this order on a front surface of a nitride semiconductor substrate 12 by using epitaxial growth technique to provide a first nitride semiconductor layer 120. Next, an annealing process (at about 850° C. for about 5 minutes) is performed to activate p-type impurities. The nitride semiconductor substrate 12 has a thickness of about 400 μm and an impurity concentration of about $1\times10^{18}$ $cm^{-3}$. The n-type nitride semiconductor layer 14 has a thickness of about 5.0 μm and an impurity concentration of about $2\times10^{16}$ $cm^{-3}$. The high concentration body region 24a has a thickness of about 0.5 μm and an impurity concentration of about $2\times10^{19}$ $cm^{-3}$. The low concentration body region 24b has a thickness of about 1.5 μm and an impurity concentration of about $1\times10^{18}$ $cm^{-3}$. As needed, a buffer layer of n-type GaN having a thickness of about 0.2 μm and an impurity concentration of about $3\times10^{18}$ $cm^{-3}$ may be provided between the nitride semiconductor substrate 12 and the n-type nitride semiconductor layer 14.

Figure 2B:
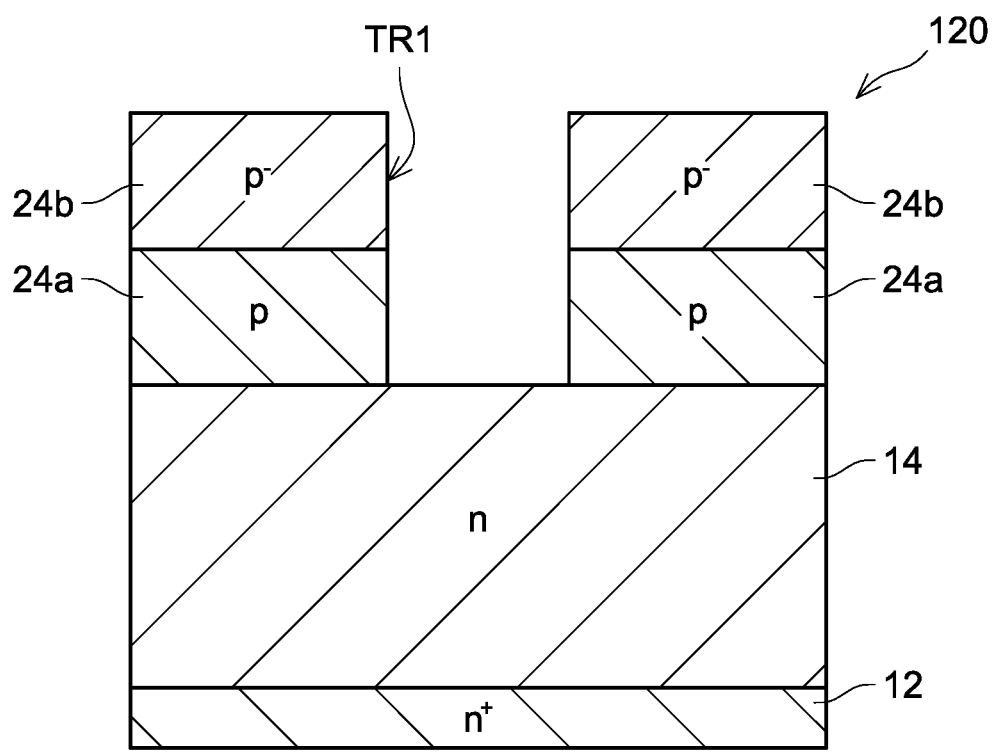
FIG. 2B schematically shows cross sectional views of the main part of the semiconductor device of FIG. 1 in a manufacturing process.

Next, as shown in FIG. 2B, a trench TR1, which penetrates the low concentration body region 24b and the high concentration body region 24a from a front surface of the first nitride semiconductor layer 120 and reaches the n-type nitride semiconductor layer 14, is formed by using dry etching technique. A front surface of the n-type nitride semiconductor layer 14 is exposed at a bottom surface of the trench TR1.

Figure 2C:
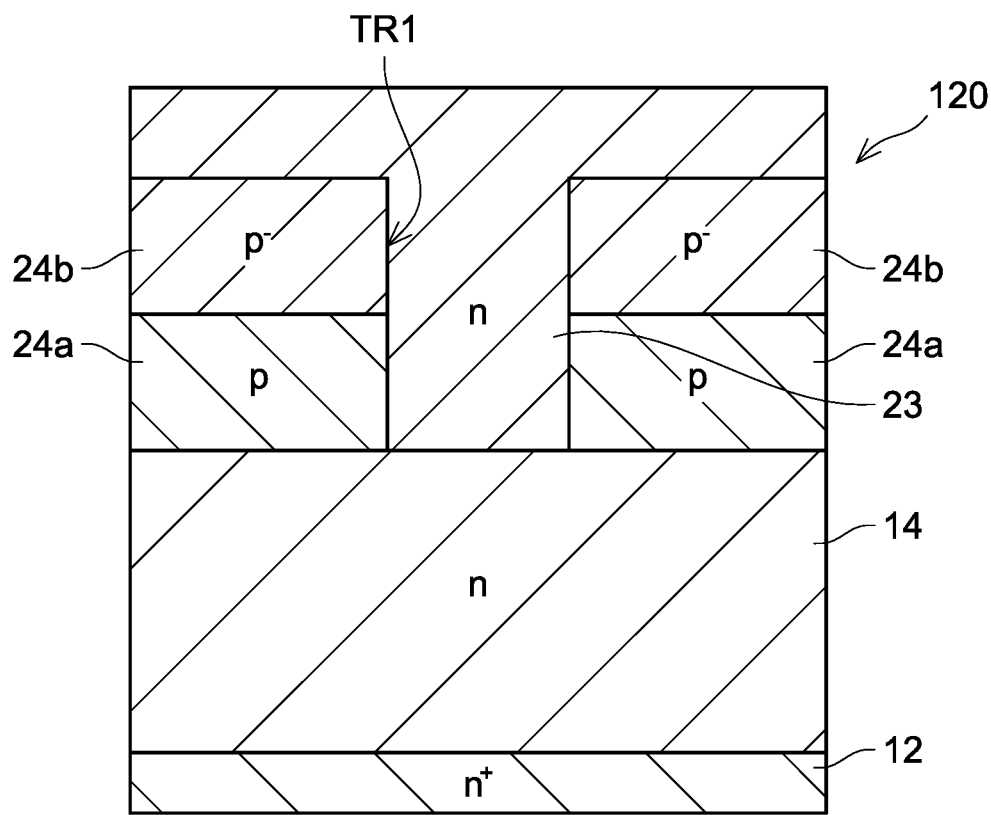
FIG. 2C schematically shows cross sectional views of the main part of the semiconductor device of FIG. 1 in a manufacturing process.

Next, as shown in FIG. 2C, the JFET region 23 of n-type GaN is formed, by using epitaxial growth technique, so as to fill the trench TR1. The JFET region 23 has an impurity concentration of about $2\times10^{16}$ $cm^{-3}$.

Figure 2D:
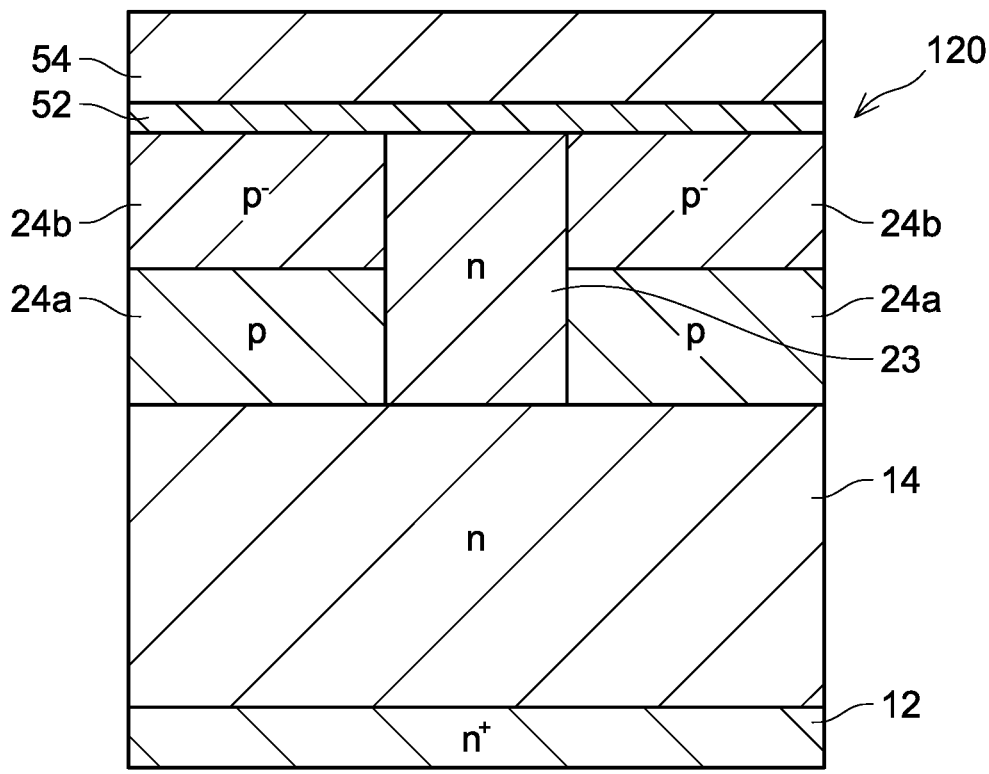
FIG. 2D schematically shows cross sectional views of the main part of the semiconductor device of FIG. 1 in a manufacturing process.

Next, as shown in FIG. 2D, the JFET region 23 deposited on a front surface of the low concentration body region 24b is removed and front surfaces of the JFET region 23 and the low concentration body region 24b are planarized by using CMP (Chemical Mechanical Polishing) technique, and thereafter a silicon support substrate 54 is adhered to the front surface of the first nitride semiconductor layer 120 via a silicon oxide film 52.

Figure 2E:
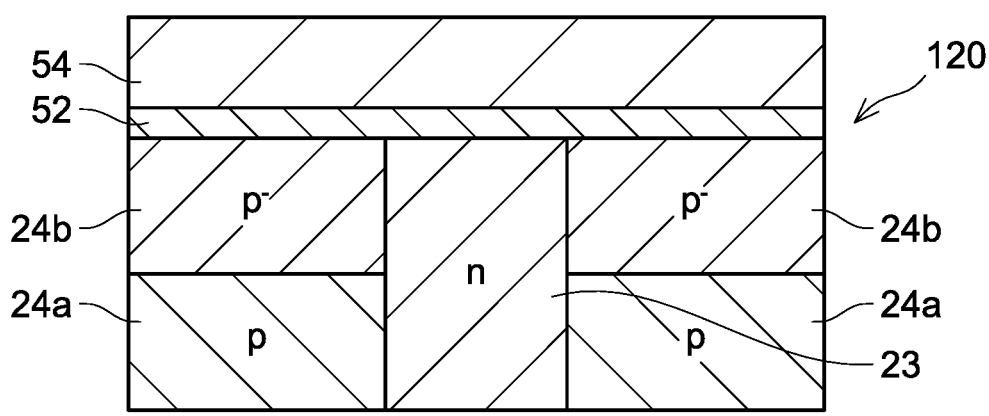
FIG. 2E schematically shows cross sectional views of the main part of the semiconductor device of FIG. 1 in a manufacturing process.

Next, as shown in FIG. 2E, the nitride semiconductor substrate 12 and the n-type nitride semiconductor layer 14 are polished from a rear surface of the first nitride semiconductor layer 120 by using CMP technique such that the JFET region 23 and the high concentration body region 24a are exposed.

Figure 2F:
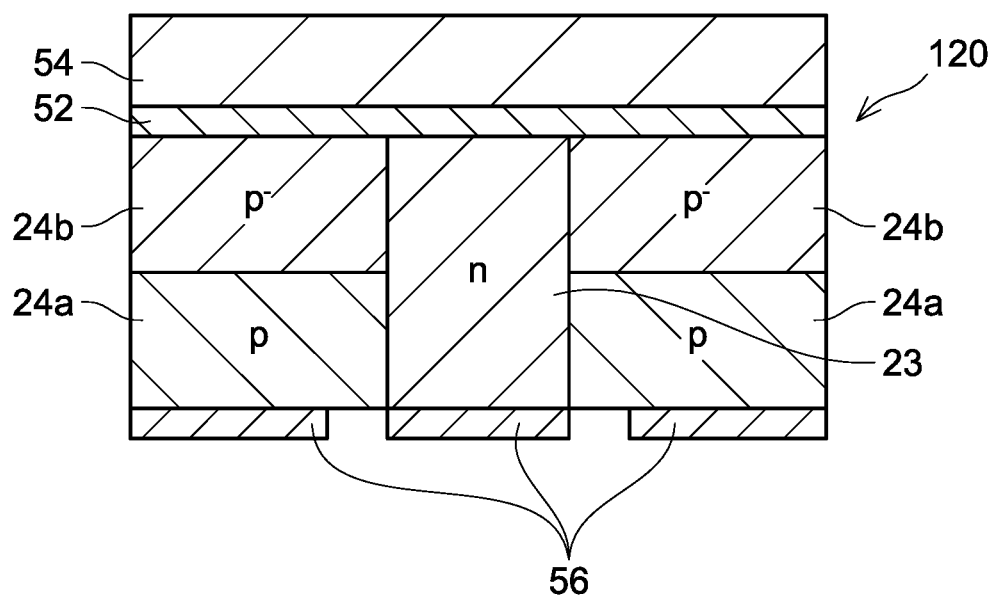
FIG. 2F schematically shows cross sectional views of the main part of the semiconductor device of FIG. 1 in a manufacturing process.

Next, as shown in FIG. 2F, a mask 56 is patterned on rear surfaces of the exposed FET region 23 and high concentration body region 24a by using photolithography technique. Parts of the high concentration body region 24a that are located near the bonded interfaces between the JFET region 23 and the high concentration body region 24a are exposed in openings of the mask 56.

Figure 2G:
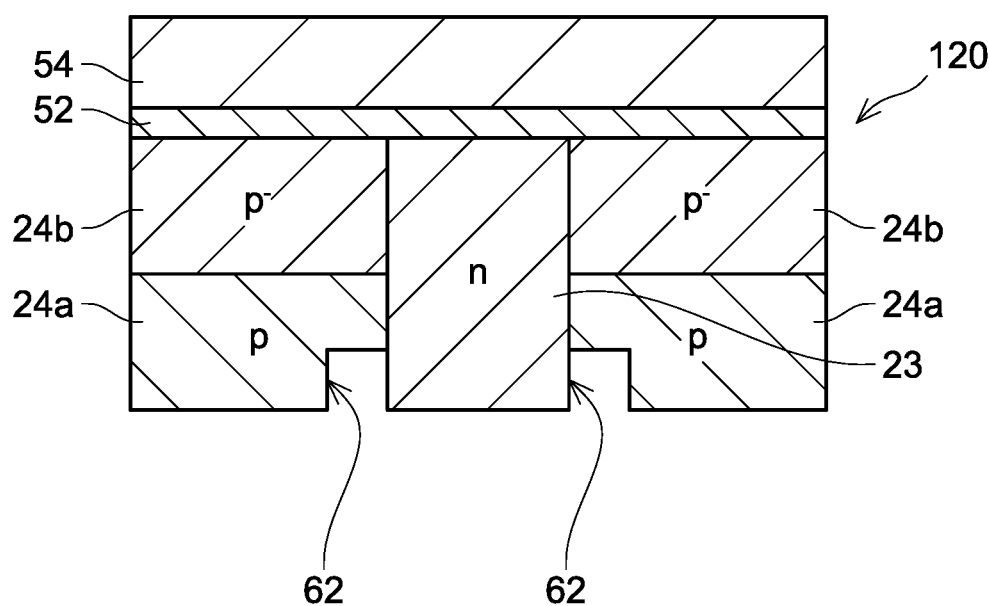
FIG. 2G schematically shows cross sectional views of the main part of the semiconductor device of FIG. 1 in a manufacturing process.

Next, as shown in FIG. 2G, the parts of the high concentration body region 24a exposed in the openings of the mask 56 are etched by using dry etching technique to form recesses 62. Inner surfaces of the recesses 62 are defined by the JFET region 23 and the high concentration body region 24a. In other words, the JFET region 23 and the high concentration body region 24a are exposed to the recesses 62.

Figure 2H:
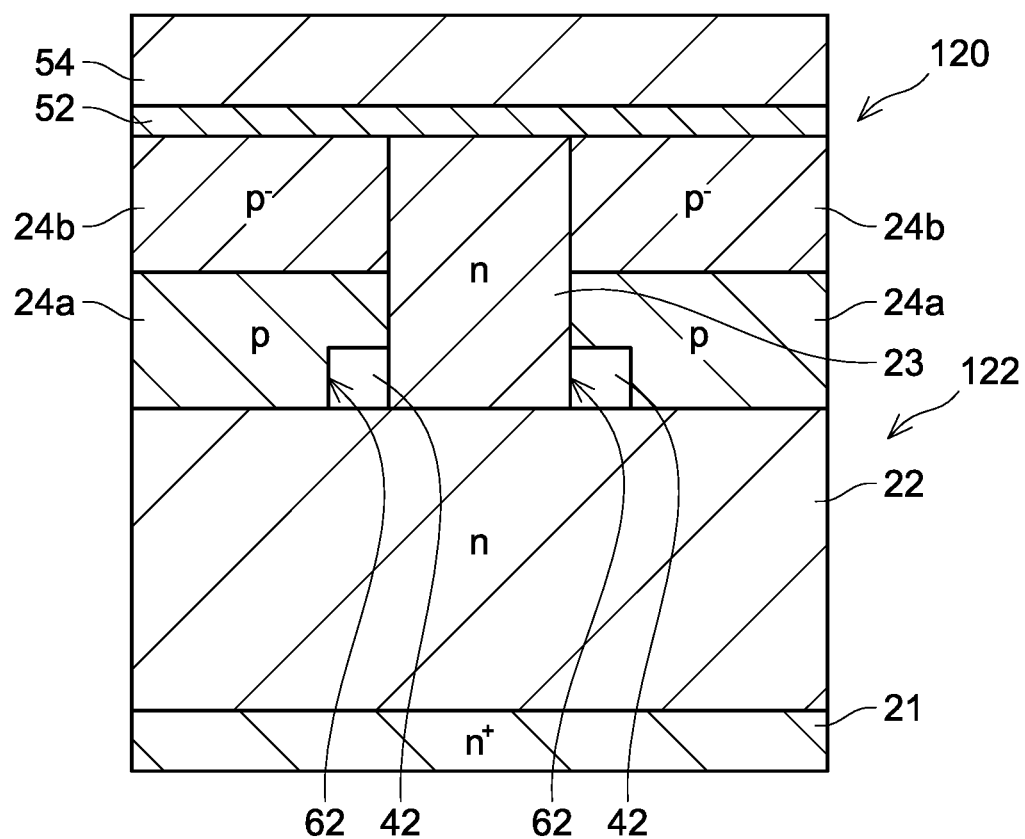
FIG. 2H schematically shows cross sectional views of the main part of the semiconductor device of FIG. 1 in a manufacturing process.

Next, as shown in FIG. 2H, a second nitride semiconductor layer 122 in which the drain region 21 and the drift region 22 are layered is provided. Here, the drain region 21 has a thickness of about 400 μm and an impurity concentration of about $1\times10^{18}$ $cm^{-3}$. The drift region 22 has a thickness of about 5.0 μm and an impurity concentration of about $2\times10^{16}$ $cm^{-3}$. The second nitride semiconductor layer 122 is formed by providing the drain region 21 as a nitride semiconductor substrate and epitaxially growing the drift region 22 from a front surface of the drain region 21. A buffer layer of n-type GaN, which has a thickness of about 0.2 μm and an impurity concentration of about $3\times10^{18}$ $cm^{-3}$, may be provided between the drain region 21 and the drift region 22, as needed. Next, a front surface (surface on a drift region 22 side) of the second nitride semiconductor layer 122 is bonded to a rear surface of the first nitride semiconductor layer 120 while maintaining the recesses 62 in the vacuum state (while maintaining a high vacuum state). As bonding technique herein, a direct bonding method or a surface activated bonding method may be used. According to the above, the spaces 42 to which the drift region 22, the JFET region 23, and the high concentration body region 24a are exposed are formed.

Figure 2I:
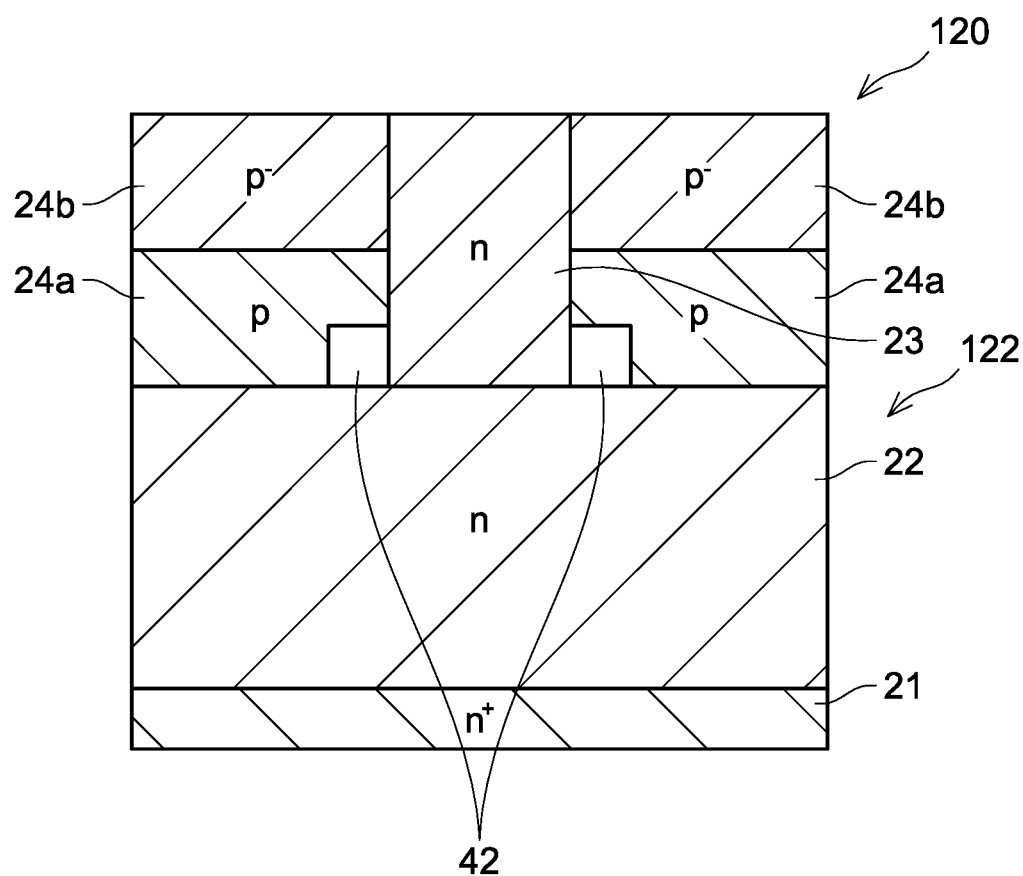
FIG. 2I schematically shows cross sectional views of the main part of the semiconductor device of FIG. 1 in a manufacturing process.

Next, as shown in FIG. 2I, the silicon oxide film 52 is dissolved by using buffered hydrofluoric acid to lift off the silicon support substrate 54.

Figure 2J:
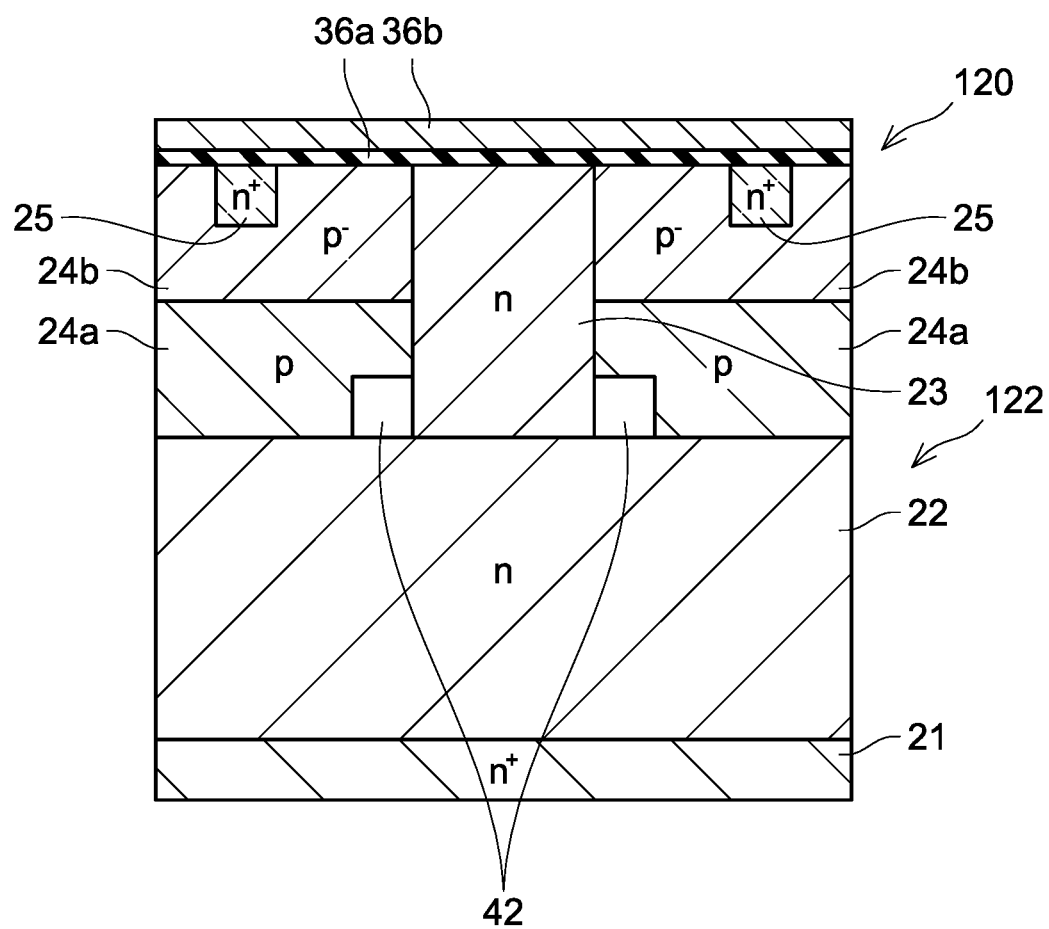
FIG. 2J schematically shows cross sectional views of the main part of the semiconductor device of FIG. 1 in a manufacturing process.

Next, as shown in FIG. 2J, the source regions 25 are formed at parts of the front surface of the low concentration body region 24b by using ion injection technique and annealing technique. Silicon is used as a dopant, and a dose thereof is about $3\times10^{15}$ $cm^{-2}$. An annealing condition is at about 1000° C. for about 20 minutes. Next, the gate insulation film 36a is formed on the front surface of the first nitride semiconductor layer 120 by using vapor deposition technique, and thereafter the gate electrode 36b is formed on a front surface of the gate insulation film 36a.

Figure 2K:
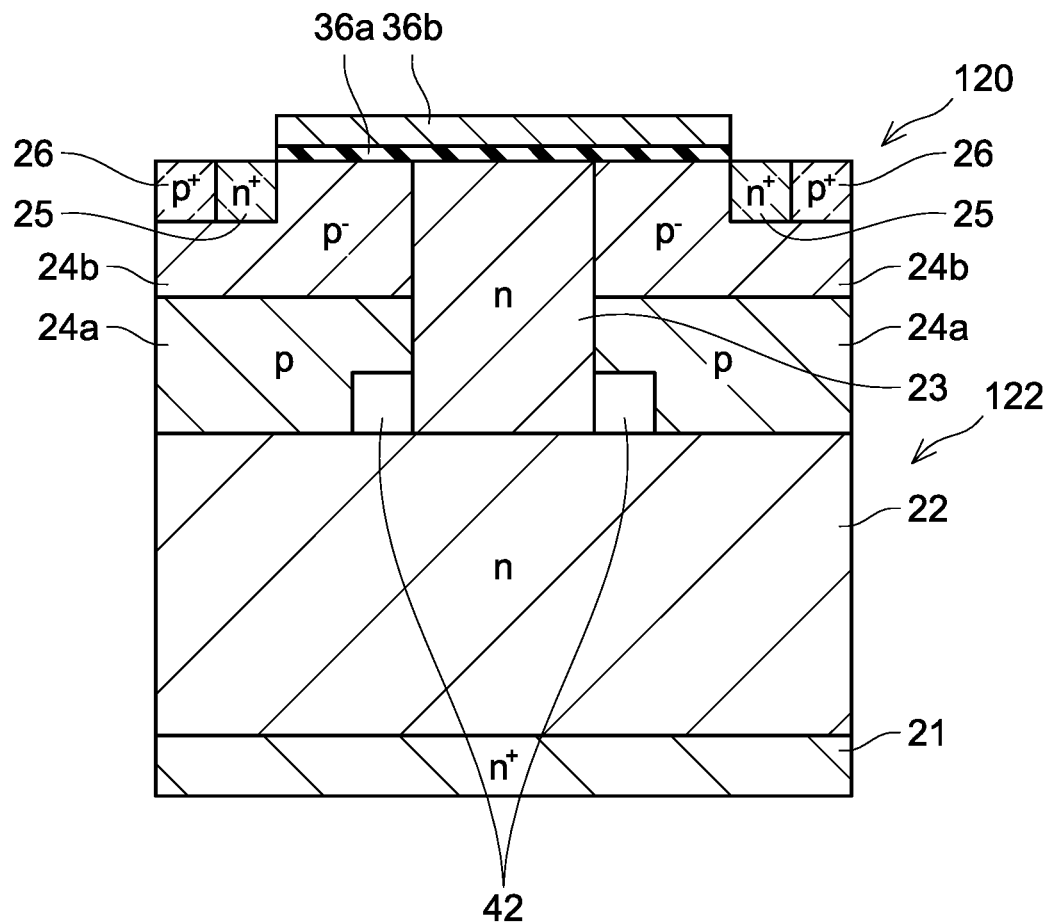
FIG. 2K schematically shows cross sectional views of the main part of the semiconductor device of FIG. 1 in a manufacturing process.

Next, as shown in FIG. 2K, after the gate insulation film 36a and the gate electrode 36b have been processed, the body contact regions 26 are formed at parts of the front surface of the low concentration body region 24b. After this, the drain electrode and the source electrode are formed by using known manufacturing technique, which completes the semiconductor device 1 shown in FIG. 1.

(Semiconductor Device of Second Embodiment)

Figure 3:
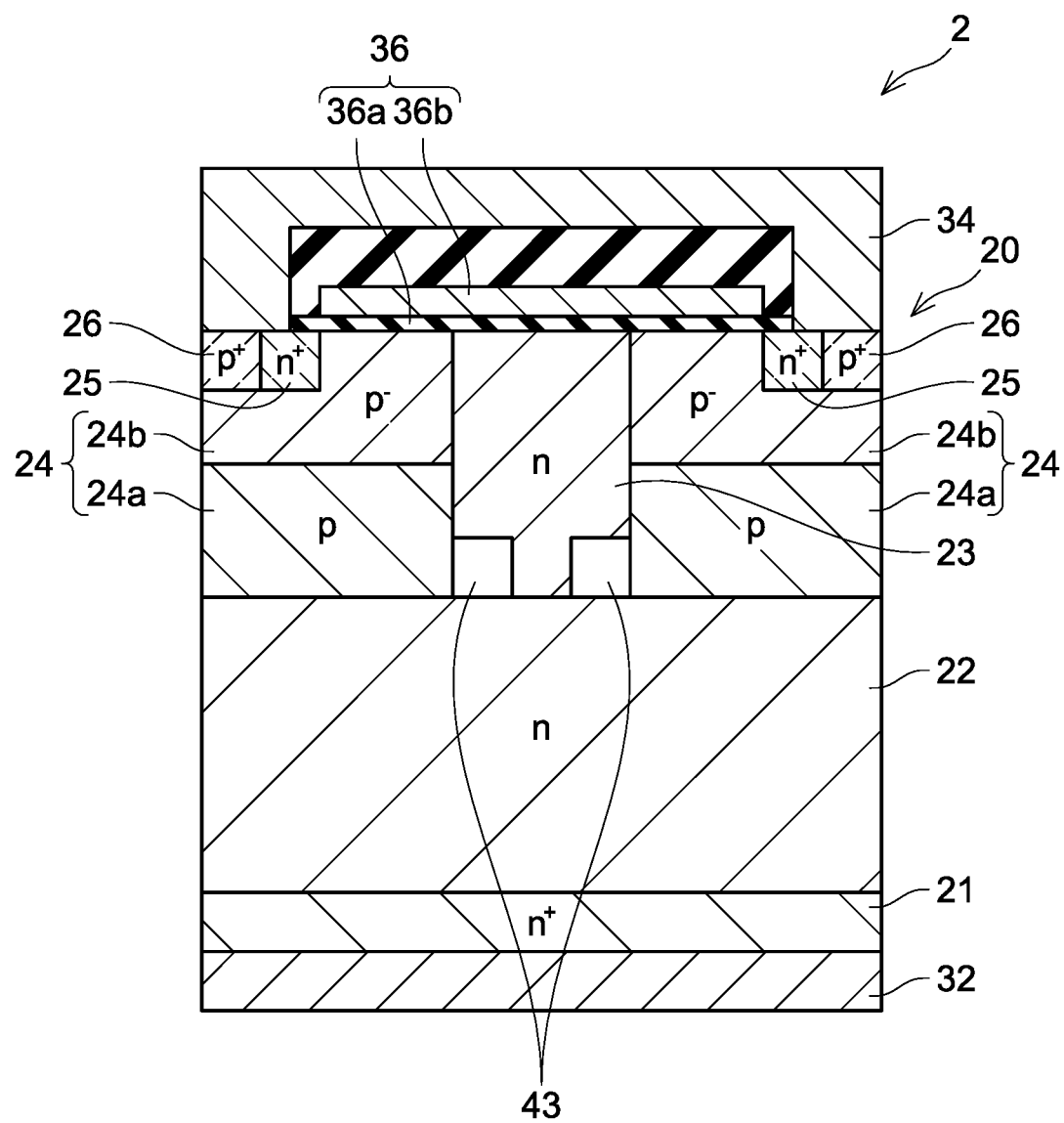
FIG. 3 schematically shows a cross sectional view of a main part of a semiconductor device in another embodiment.

FIG. 3 shows a cross-sectional view of a main part of a semiconductor device 2 of a second embodiment. In this semiconductor device 2, spaces 43 are located at parts within an area where the JFET region 23 exists as viewed in the direction orthogonal to the front surface of the nitride semiconductor layer 20. Each of the spaces 43 is provided to correspond to a portion where the bonded interface between the drift region 22 and the JFET region 23, the bonded interface between the drift region 22 and the high concentration body region 24a, and the bonded interface between the JFET region 23 and the high concentration body region 24a intersect each other. Inner surfaces of the spaces 43 are defined by the drift region 22, the JFET region 23, and the high concentration body region 24a. More specifically, the spaces 43 are provided by removing parts of the JFET region 23 that are on a drift region 22 side and on a high concentration body region 24a side. As above, the drift region 22, the JFET region 23, and the high concentration body region 24a are exposed to the spaces 43. In the semiconductor device 2 as well, the spaces 43 in the vacuum state are provided at portions where electric field concentrates, thus dielectric breakdown at the portions where the electric field concentrates is suppressed.

(Semiconductor Device of Third Embodiment)

Figure 4:
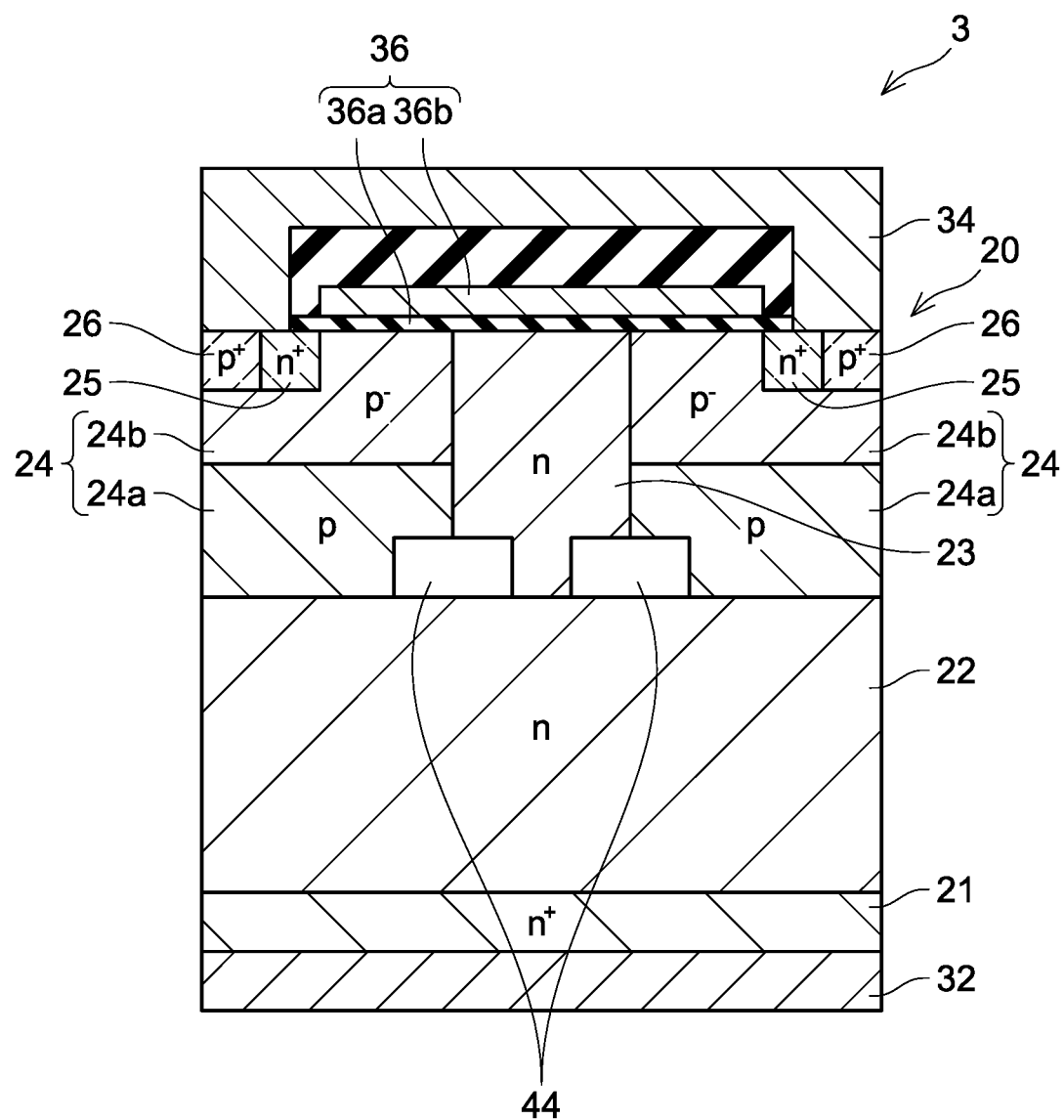
FIG. 4 schematically shows a cross sectional view of a main part of a semiconductor device in yet another embodiment.

FIG. 4 shows a cross-sectional view of a main part of a semiconductor device 3 of a third embodiment. In this semiconductor device 3, each of spaces 44 is located to traverse over a part within the area where the JFET region 23 exists and a part within the area where the high concentration body region 24a exists, as viewed in the direction orthogonal to the front surface of the nitride semiconductor layer 20. Each of the spaces 44 is provided to correspond to the portion where the bonded interface between the drift region 22 and the JFET region 23, the bonded interface between the drift region 22 and the high concentration body region 24a, and the bonded interface between the JFET region 23 and the high concentration body region 24a intersect each other. Inner surfaces of the spaces 44 are defined by the drift region 22, the JFET region 23, and the high concentration body region 24a. More specifically, the spaces 44 are provided by removing parts of the JFET region 23 that are on the drift region 22 side and on the high concentration body region 24a sides as well as parts of the high concentration body region 24a that are on the drift region 22 side and on the JFET region 23 side. As above, the drift region 22, the JFET region 23, and the high concentration body region 24a are exposed to the spaces 44. In the semiconductor device 3 as well, the spaces 44 in the vacuum state are provided at portions where electric field concentrates, thus dielectric breakdown at the portions where the electric field concentrates is suppressed.

(Semiconductor Device of Fourth Embodiment)

Figure 5:
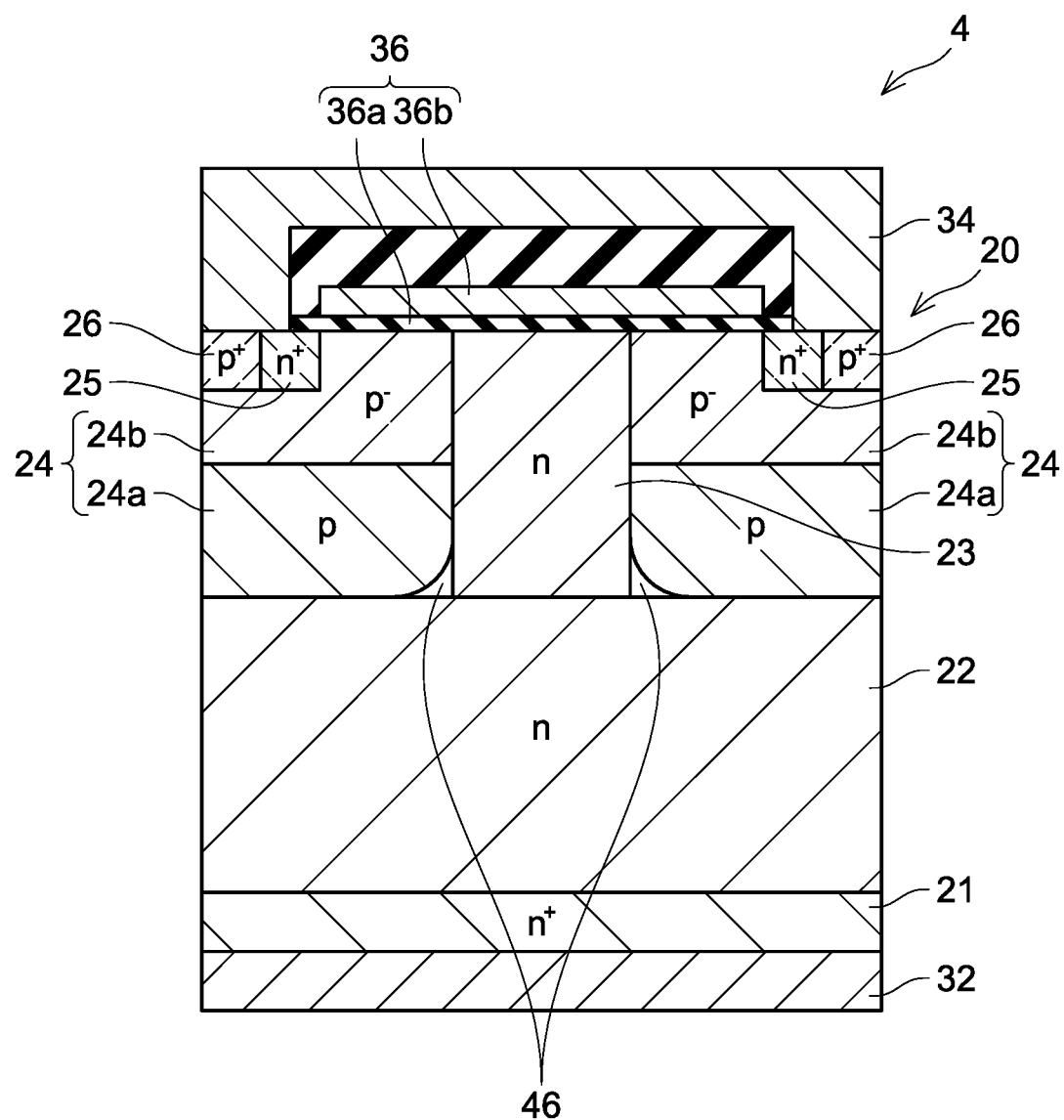
FIG. 5 schematically shows a cross sectional view of a main part of a semiconductor device in still another embodiment.

FIG. 5 shows a cross-sectional view of a main part of a semiconductor device 4 of a fourth embodiment. In this semiconductor device 4, spaces 46 are located at parts within the area where the high concentration body region 24a exist as viewed in the direction orthogonal to the front surface of the nitride semiconductor layer 20. Each of the spaces 46 is provided to correspond to the portion where the bonded interface between the drift region 22 and the JFET region 23, the bonded interface between the drift region 22 and the high concentration body region 24a, and the bonded interface between the JFET region 23 and the high concentration body region 24a intersect each other. Inner surfaces of the spaces 46 are defined by the drift region 22, the JFET region 23, and the high concentration body region 24a. More specifically, the spaces 46 are provided by removing parts of the high concentration body region 24a that are on the drift region 22 side and on the JFET region 23 side. As above, the drift region 22, the JFET region 23, and the high concentration body region 24a are exposed to the spaces 46.

Further, each of the inner surfaces of the spaces 46 includes a curved surface. In this embodiment, the inner surfaces of the spaces 46 defined by the high concentration body region 24a, in other words, surfaces of the high concentration body region 24a exposed to the spaces 46, are curved surfaces that project toward the spaces 46. As above, since corners of the high concentration body region 24a are provided with the curved surfaces, electric field is alleviated at the portions where electric field concentrates. Due to this, in the semiconductor device 4, dielectric breakdown at the portions where electric field concentrates is further suppressed.

(Method of Manufacturing Semiconductor Device of Fourth Embodiment)

Figure 6A:
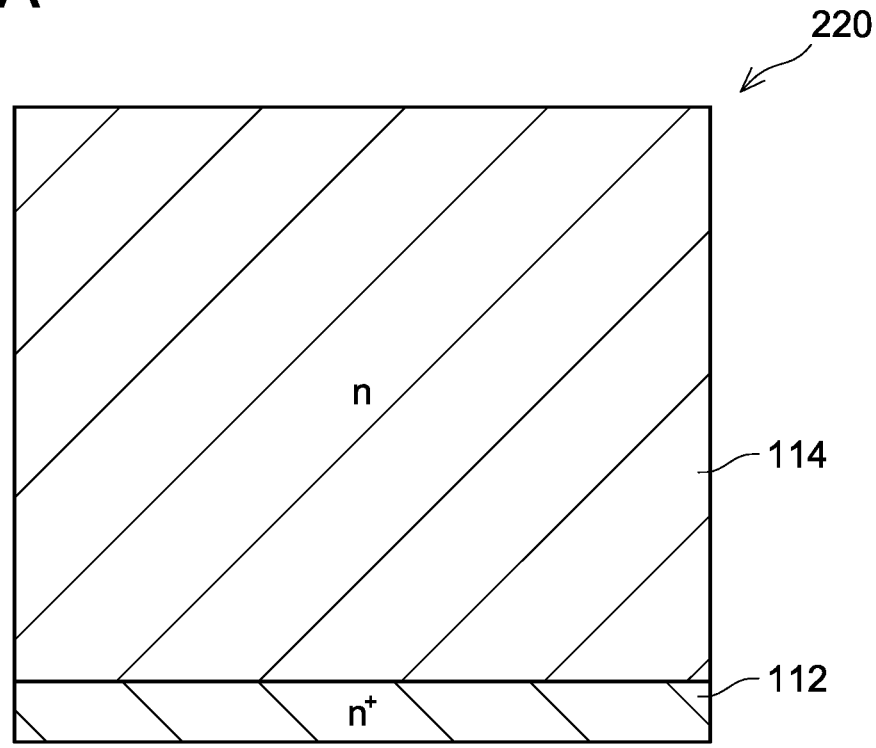
FIG. 6A schematically shows a cross sectional view of the main part of the semiconductor device of FIG. 5 in a manufacturing process.

Next, a method of manufacturing the semiconductor device 4 will be described. Firstly, as shown in FIG. 6A, an n-type nitride semiconductor layer 114 of n-type GaN is formed on a front surface of a nitride semiconductor substrate 112 by using epitaxial growth technique to provide a first nitride semiconductor layer 220. The nitride semiconductor substrate 112 has a thickness of about 400 μm and an impurity concentration of about $1\times10^{18}$ cm$^{-3}$. The n-type nitride semiconductor layer 114 has a thickness of about 7.0 μm and an impurity concentration of about $2\times10^{16}$ cm$^{-3}$. As needed, a buffer layer of n-type GaN, which has a thickness of about 0.2 μm and an impurity concentration of about $3\times10^{18}$ cm$^{-3}$, may be provided between the nitride semiconductor substrate 112 and the n-type nitride semiconductor layer 114.

Figure 6B:
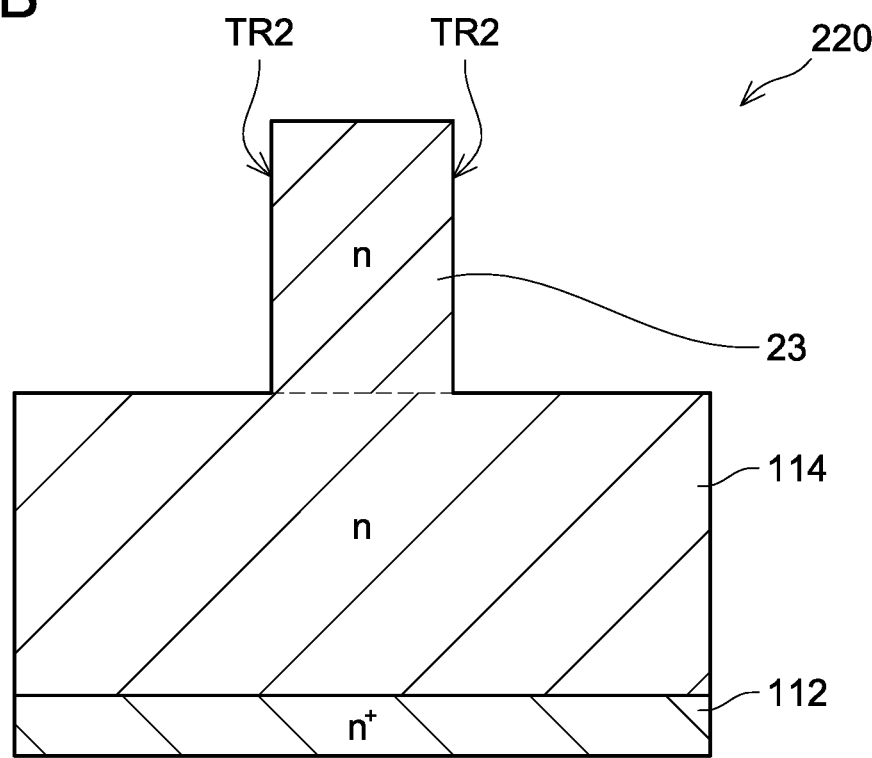
FIG. 6B schematically shows the cross sectional view of the main part of the semiconductor device of FIG. 5 in a manufacturing process.

Next, as shown in FIG. 6B, trenches TR2 are formed by removing parts of the n-type nitride semiconductor layer 114 from a front surface of the first nitride semiconductor layer 220 by using dry etching technique. A part of the n-type nitride semiconductor layer 114 that remains between the trenches TR2 next to each other becomes the JFET region 23.

Figure 6C:
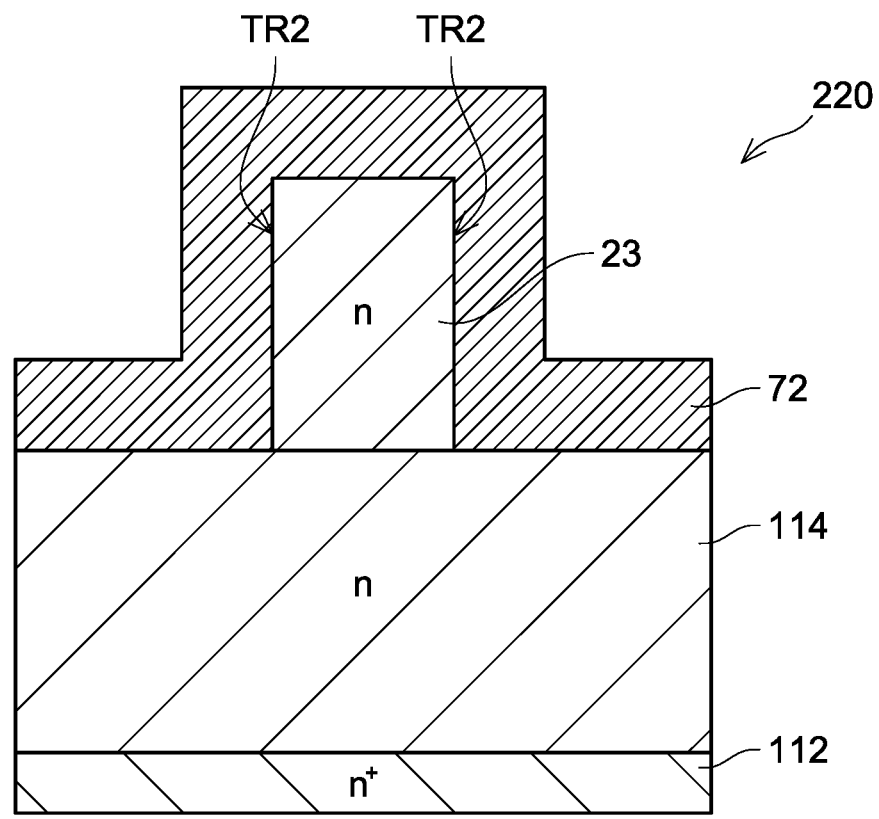
FIG. 6C schematically shows the cross sectional view of the main part of the semiconductor device of FIG. 5 in a manufacturing process.
Figure 6D:
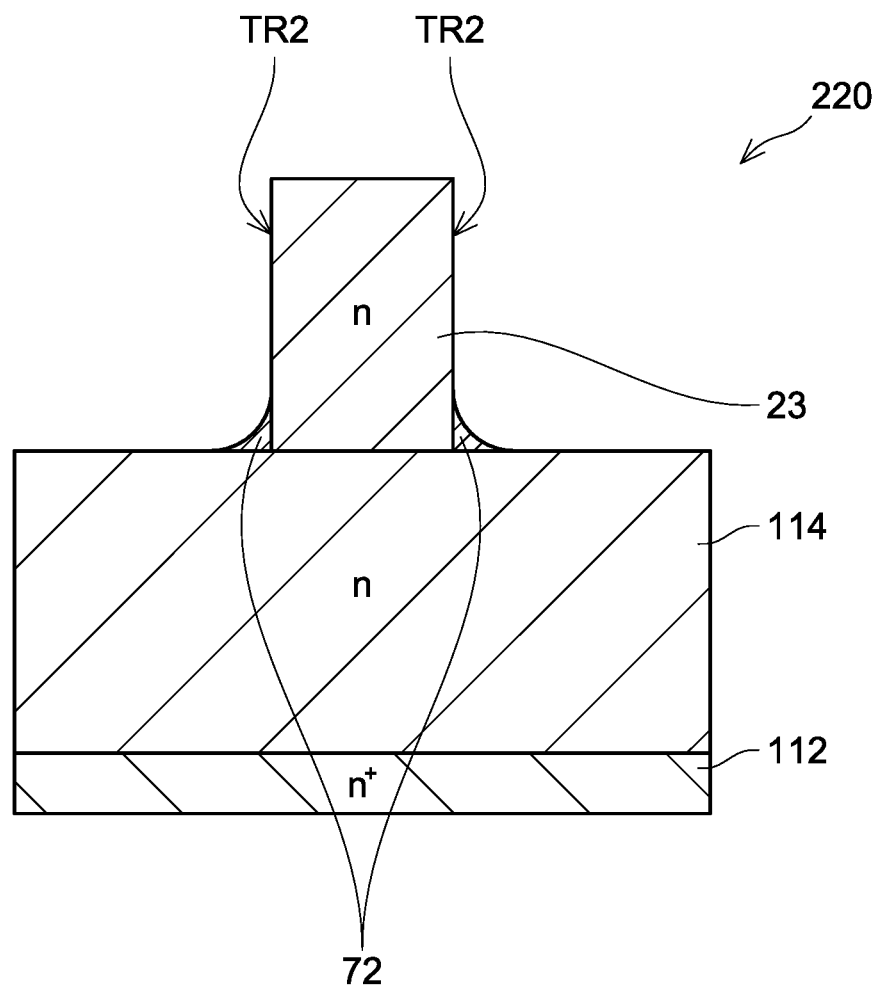
FIG. 6D schematically shows the cross sectional view of the main part of the semiconductor device of FIG. 5 in a manufacturing process.

Next, as shown in FIG. 6C, a silicon oxide film 72 is formed on inner surfaces of the trenches TR2 by using vapor deposition technique. The silicon oxide film 72 is an example of a sacrificial layer.

Next, as shown in FIG. 61D, the silicon oxide film 72 is removed by using buffered hydrofluoric acid. At this occasion, parts of the silicon oxide film 72 are selectively left to remain at corners between side surfaces and bottom surfaces of the trenches TR2. Since wet etching technique is used here, surfaces of the remaining parts of the silicon oxide film 72 are curved in a concave shape. In this process, portions where the silicon oxide film 72 does not remain, that is, surfaces of the n-type nitride semiconductor layer 114 and the JFET region 23, are surely exposed.

Figure 6E:
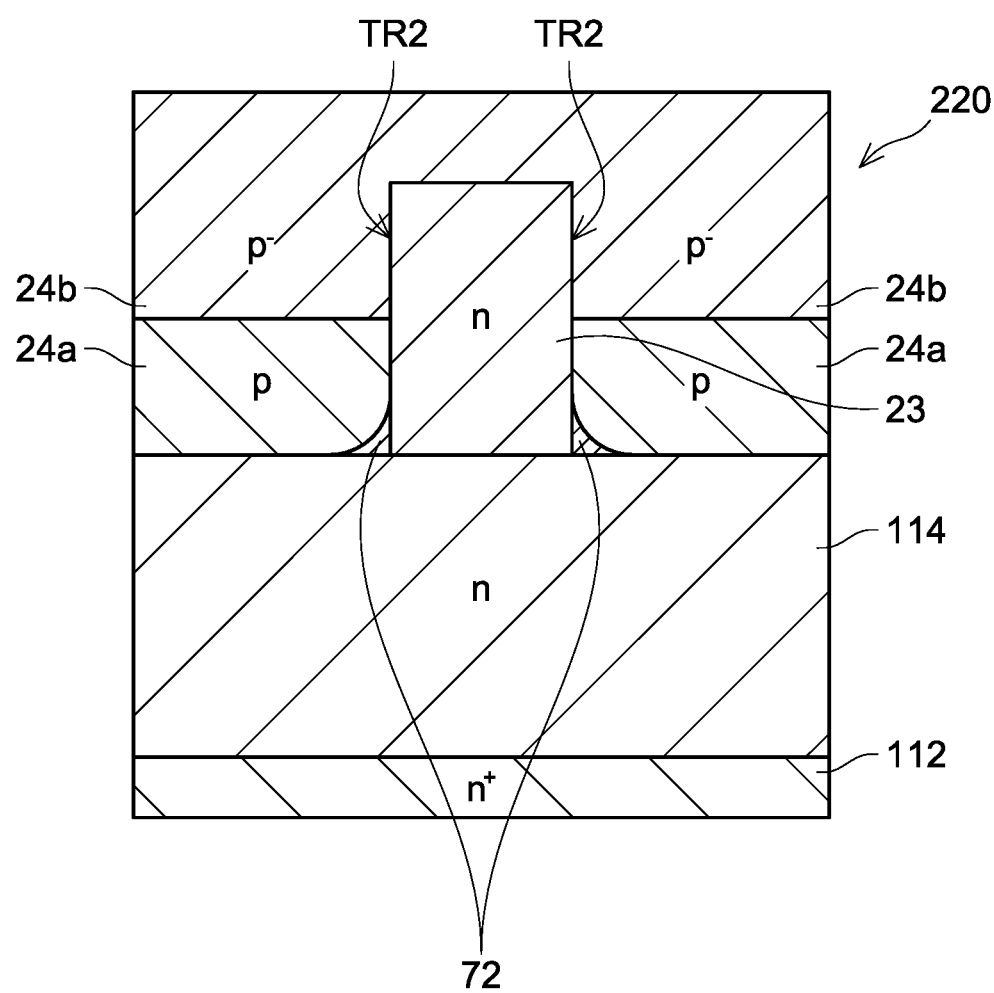
FIG. 6E schematically shows the cross sectional view of the main part of the semiconductor device of FIG. 5 in a manufacturing process.

Next, as shown in FIG. 6E, the high concentration body region 24a and the low concentration body region 24b of p-type GaN are layered in this order, by using epitaxial growth technique, so as to fill the trenches TR2. Next, an annealing process (at about 850° C. for about 5 minutes) is performed in order to activate p-type impurities. The high concentration body region 24a has a thickness of about 0.5 μm and an impurity concentration of about $2\times10^{19}$ cm$^{-3}$. The low concentration body region 24b has a thickness of about 4 μm and an impurity concentration of about $1\times10^{18}$ cm$^{-3}$.

Figure 6F:
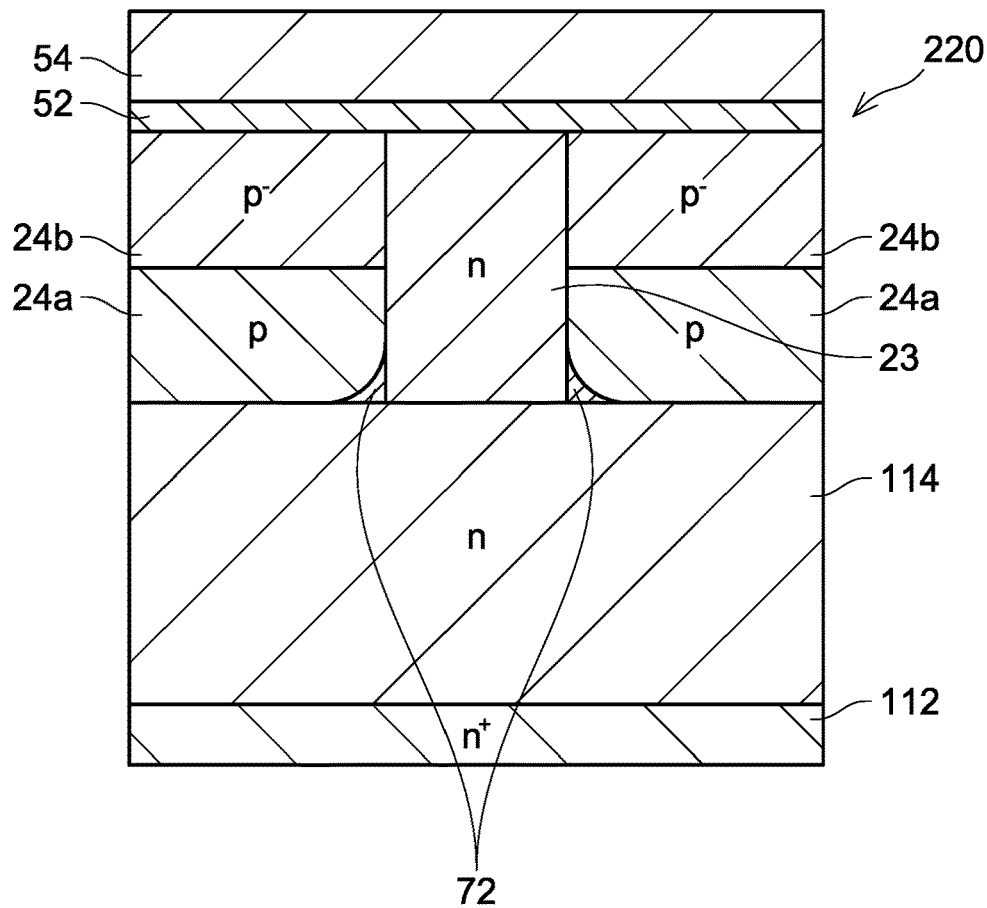
FIG. 6F schematically shows the cross sectional view of the main part of the semiconductor device of FIG. 5 in a manufacturing process.
Figure 6G:
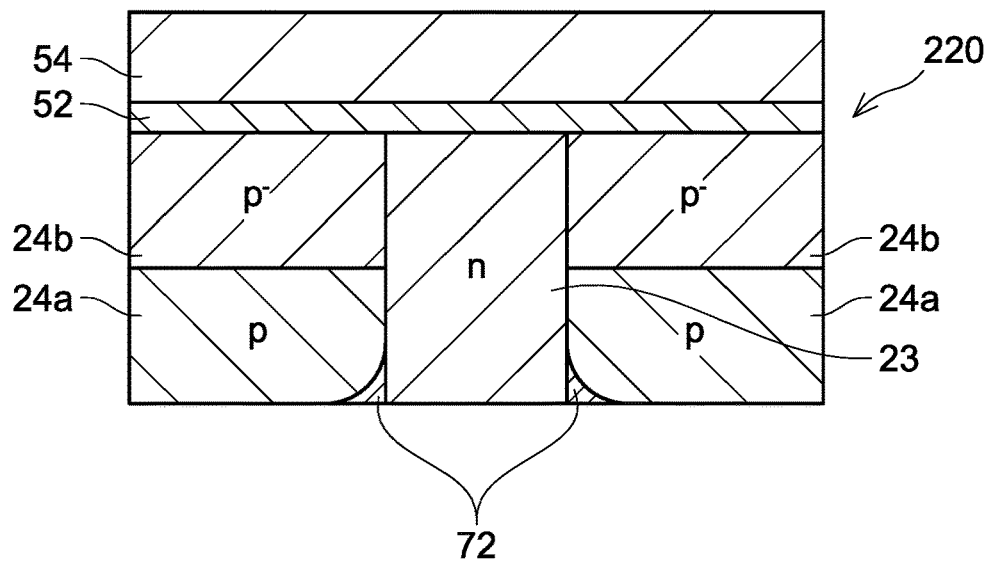
FIG. 6G schematically shows the cross sectional view of the main part of the semiconductor device of FIG. 5 in a manufacturing process.

Next, as shown in FIG. 6F, the low concentration body region 24b formed on the front surface of the JFET region 23 is removed and the front surfaces of the JFET region 23 and the low concentration body region 24b are planarized by using CMP technique, and thereafter the silicon support substrate 54 is adhered to the front surface of the first nitride semiconductor layer 220 via the silicon oxide film 52.

Next, as shown in FIG. 6O, the nitride semiconductor substrate 112 and the n-type nitride semiconductor layer 114 are polished from a rear surface of the first nitride semiconductor layer 220 by using CMP technique such that the JFET region 23, the high concentration body region 24a, and the remaining parts of the silicon oxide film 72 are exposed.

Figure 6H:
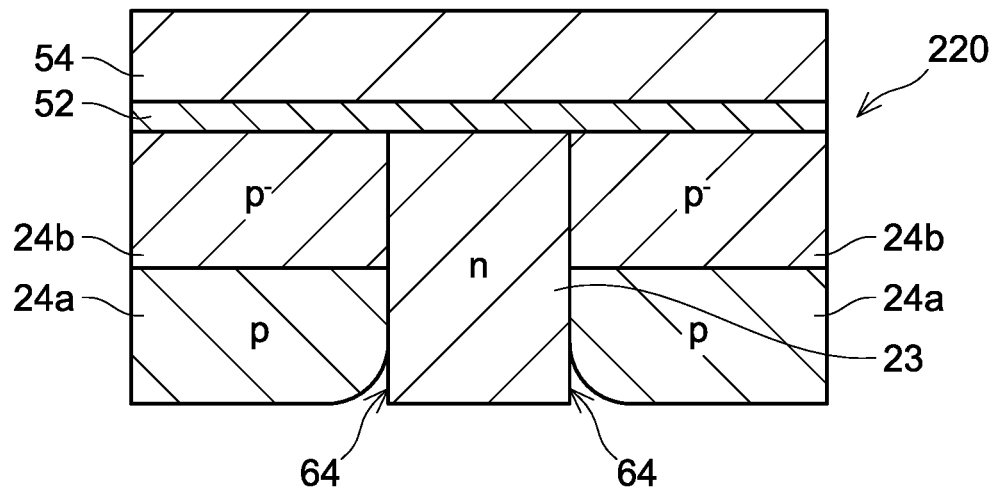
FIG. 6H schematically shows the cross sectional view of the main part of the semiconductor device of FIG. 5 in a manufacturing process.

Next, as shown in FIG. 6H, the remaining parts of the silicon oxide film 72 are removed by using buffered hydrofluoric acid to form recesses 64. Inner surfaces of the recesses 64 are defined by the JFET region 23 and the high concentration body region 24a. In other words, the JFET region 23 and the high concentration body region 24a are exposed to the recesses 64. Further, surfaces of the high concentration body region 24a that are exposed to the recesses 64 are curved surfaces projecting toward the recesses 64.

Figure 6I:
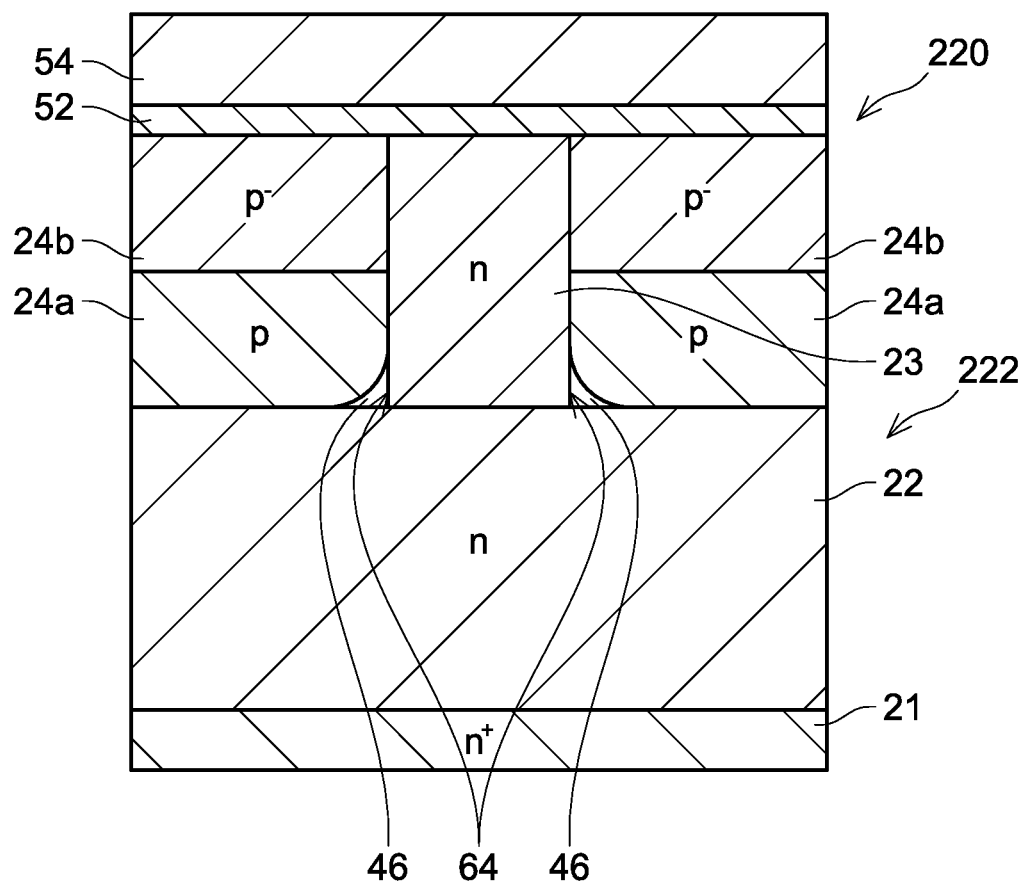
FIG. 6I schematically shows the cross sectional view of the main part of the semiconductor device of FIG. 5 in a manufacturing process.

Next, as shown in FIG. 6I, a second nitride semiconductor layer 222 in which the drain region 21 and the drift region 22 are layered is provided. Here, the drain region 21 has a thickness of about 400 μm and an impurity concentration of about $1\times10^{18}$ cm$^{-3}$. The drift region 22 has a thickness of about 5.0 μm and an impurity concentration of about $2\times10^{16}$ cm$^{-3}$. The second nitride semiconductor layer 222 is formed by providing the drain region 21 as a nitride semiconductor substrate and epitaxially growing the drift region 22 from a front surface of the drain region 21. A buffer layer of n-type GaN, which has a thickness of about 0.2 µm and an impurity concentration of about $3\times10^{18}$ cm$^{-3}$, may be provided between the drain region 21 and the drift region 22, as needed. Next, a front surface (surface on a drift region 22 side) of the second nitride semiconductor layer 222 is bonded to a rear surface of the first nitride semiconductor layer 220 while maintaining the recesses 64 in the vacuum state (while maintaining a high vacuum state). As bonding technique herein, a direct bonding method or a surface activated bonding method may be used. According to the above, the spaces 46 to which the drift region 22, the JFET region 23, and the high concentration body region 24a are exposed are formed.

Figure 6J:
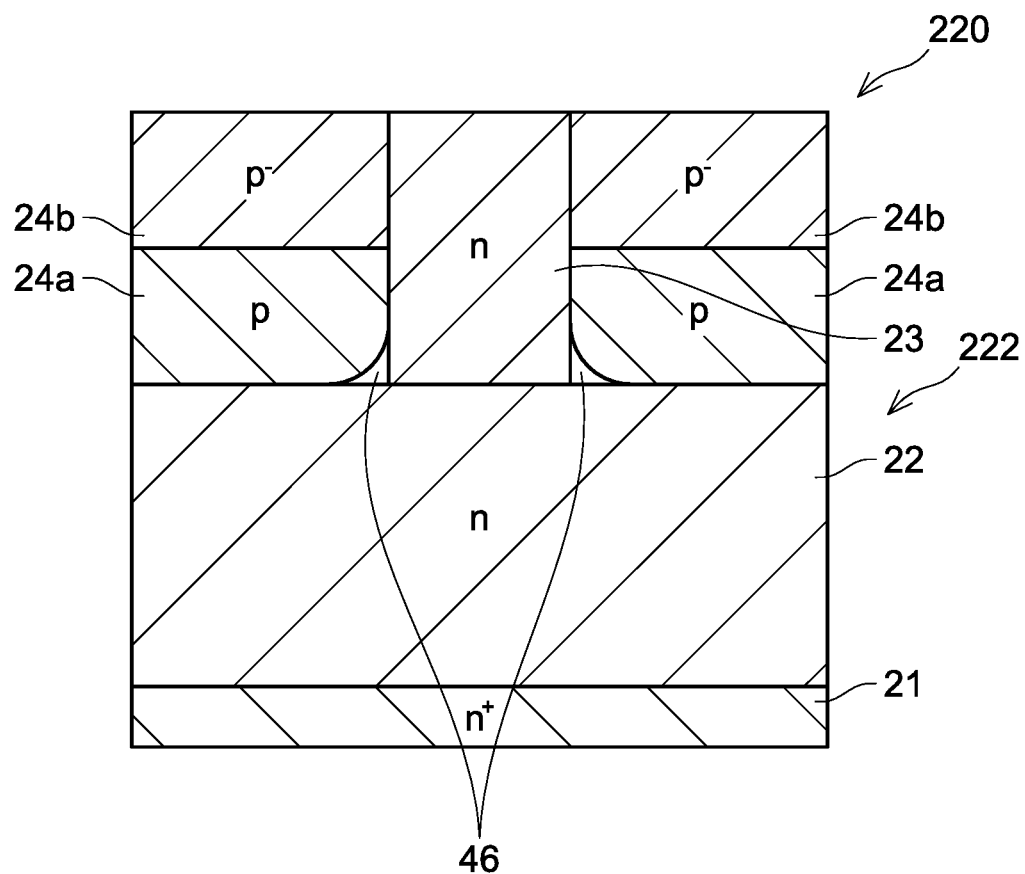
FIG. 6J schematically shows the cross sectional view of the main part of the semiconductor device of FIG. 5 in a manufacturing process.

Next, as shown in FIG. 6J, the silicon oxide film 52 is dissolved by using buffered hydrofluoric acid to lift off the silicon support substrate 54.

Figure 6K:
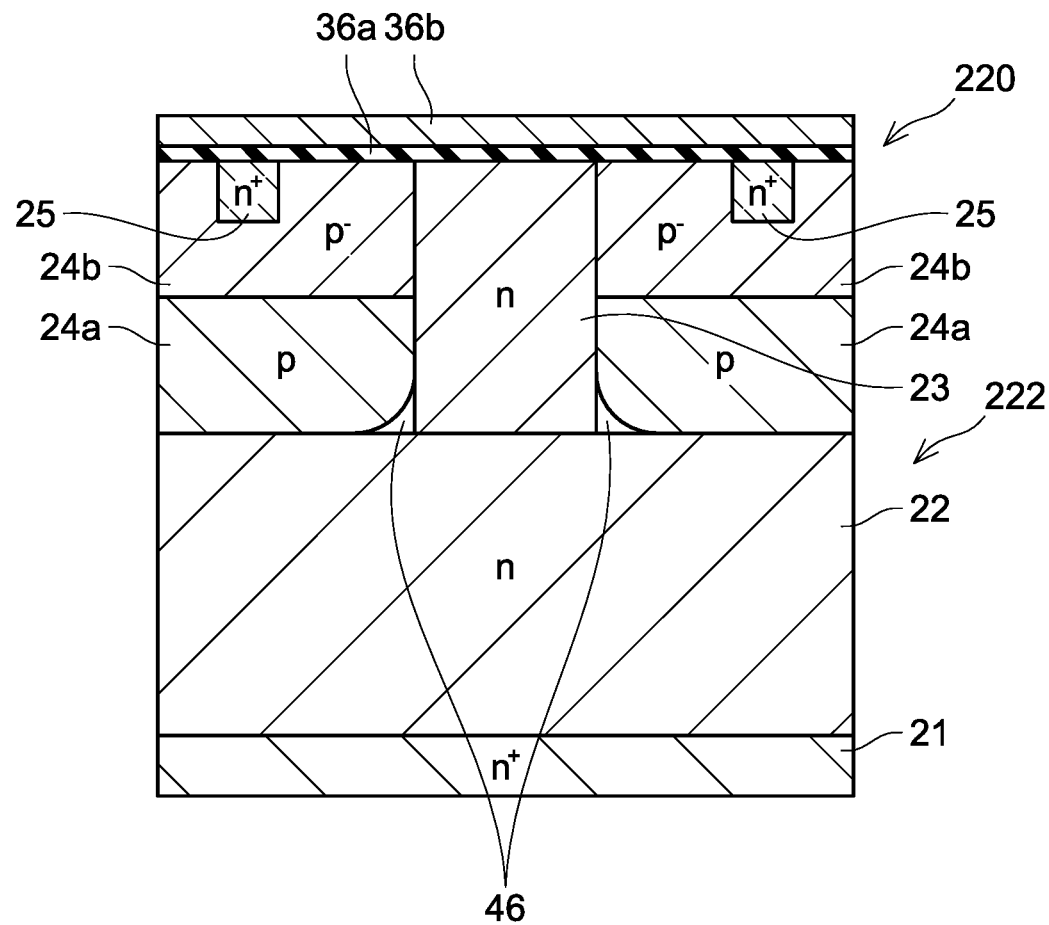
FIG. 6K schematically shows the cross sectional view of the main part of the semiconductor device of FIG. 5 in a manufacturing process.

Next, as shown in FIG. 6K, the source regions 25 are formed at parts of the front surface of the low concentration body region 24b by using ion injection technique and annealing technique. Silicon is used as a dopant, and a dose thereof is about $3\times10^{15}$ cm$^{-2}$. An annealing condition is at about 1000° C. for about 20 minutes. Next, by using vapor deposition technique, the gate insulation film 36a is formed on the front surface of the first nitride semiconductor layer 220, and thereafter the gate electrode 36b is formed on a front surface of the gate insulation film 36a.

Figure 6L:
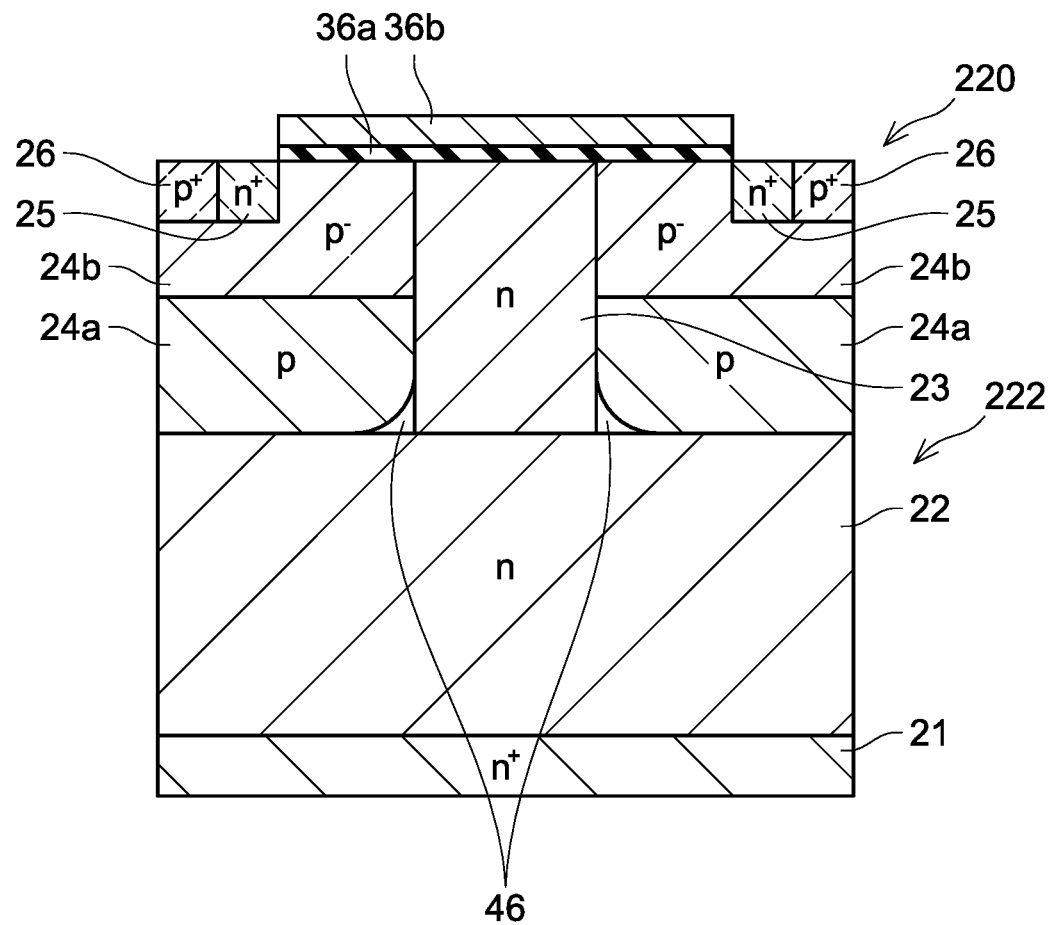
FIG. 6L schematically shows the cross sectional view of the main part of the semiconductor device of FIG. 5 in a manufacturing process.

Next, as shown in FIG. 6L, after the gate insulation film 36a and the gate electrode 36b have been processed, the body contact regions 26 are formed at parts of the front surface of the low concentration body region 24b. After this, the drain electrode and the source electrode are formed by using known manufacturing technique, which completes the semiconductor device 4 shown in FIG. 5.

(Semiconductor Device of Fifth Embodiment)

Figure 7:
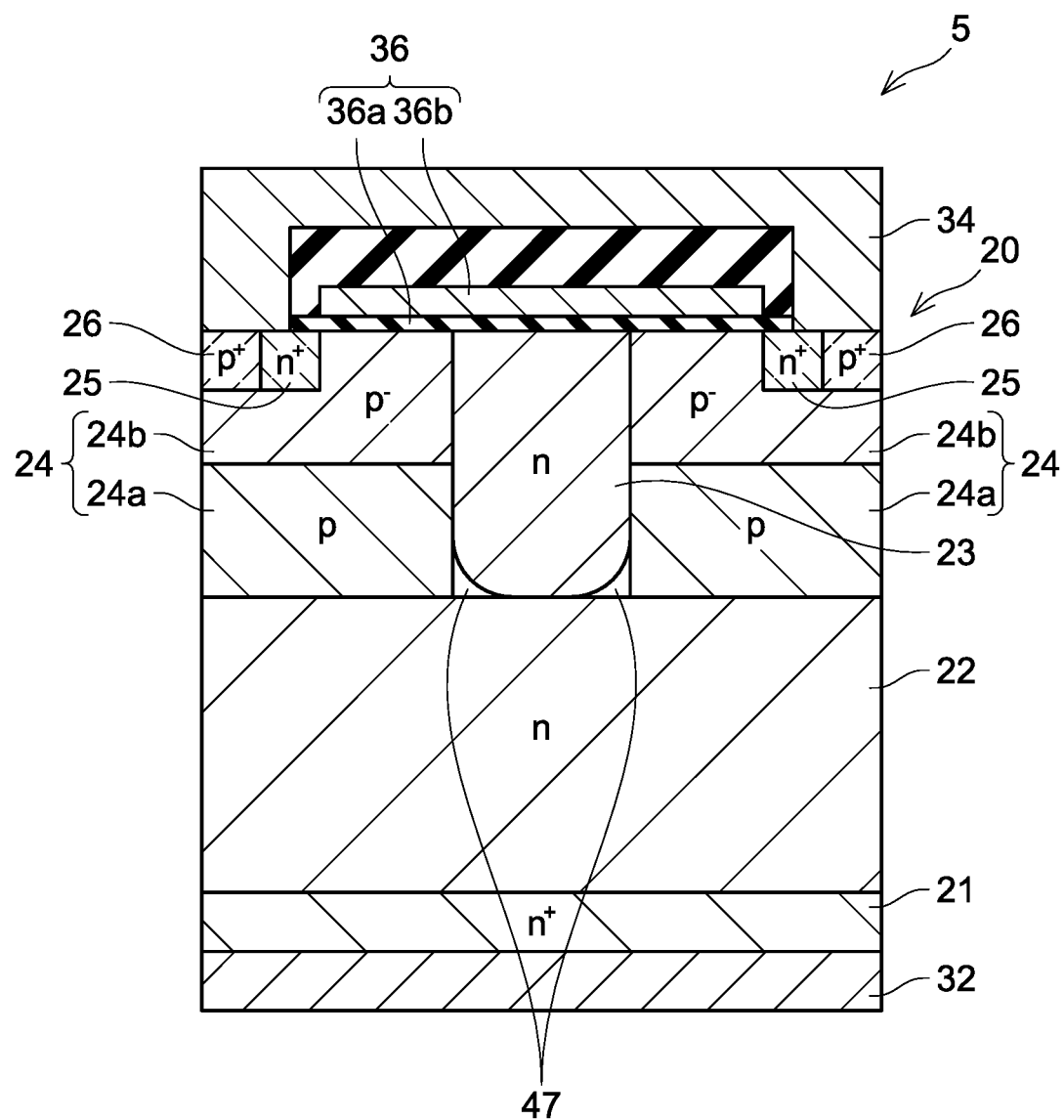
FIG. 7 schematically shows a cross sectional view of a main part of a semiconductor device in another embodiment.

FIG. 7 shows a cross-sectional view of a main part of a semiconductor device 5 of a fifth embodiment. In this semiconductor device 5, spaces 47 are located at parts within the area where the JFET region 23 exists as viewed in the direction orthogonal to the front surface of the nitride semiconductor layer 20. Each of the spaces 47 is provided to correspond to a portion where the bonded interface between the drift region 22 and the JFET region 23, the bonded interface between the drift region 22 and the high concentration body region 24a, and the bonded interface between the JFET region 23 and the high concentration body region 24a intersect each other. Inner surfaces of the spaces 47 are defined by the drift region 22, the JFET region 23, and the high concentration body region 24a. More specifically, the spaces 47 are provided by removing parts of the JFET region 23 that are on the drift region 22 side and on the high concentration body region 24a sides. As above, the drift region 22, the JFET region 23, and the high concentration body region 24a are exposed to the spaces 47.

Further, each of the inner surfaces of the spaces 47 includes a curved surface. In this embodiment, the inner surfaces of the spaces 47 defined by the JFET region 23, in other words, surfaces of the JFET region 23 exposed to the spaces 47, are curved surfaces that project toward the spaces 47. As above, since corners of the JFET region 23 are provided with the curved surfaces, electric field at these portions where electric field concentrates is alleviated. Due to this, in the semiconductor device 5, dielectric breakdown at the portions where the electric field concentrates is further suppressed.

(Method of Manufacturing Semiconductor Device of Fifth Embodiment)

Figure 8A:
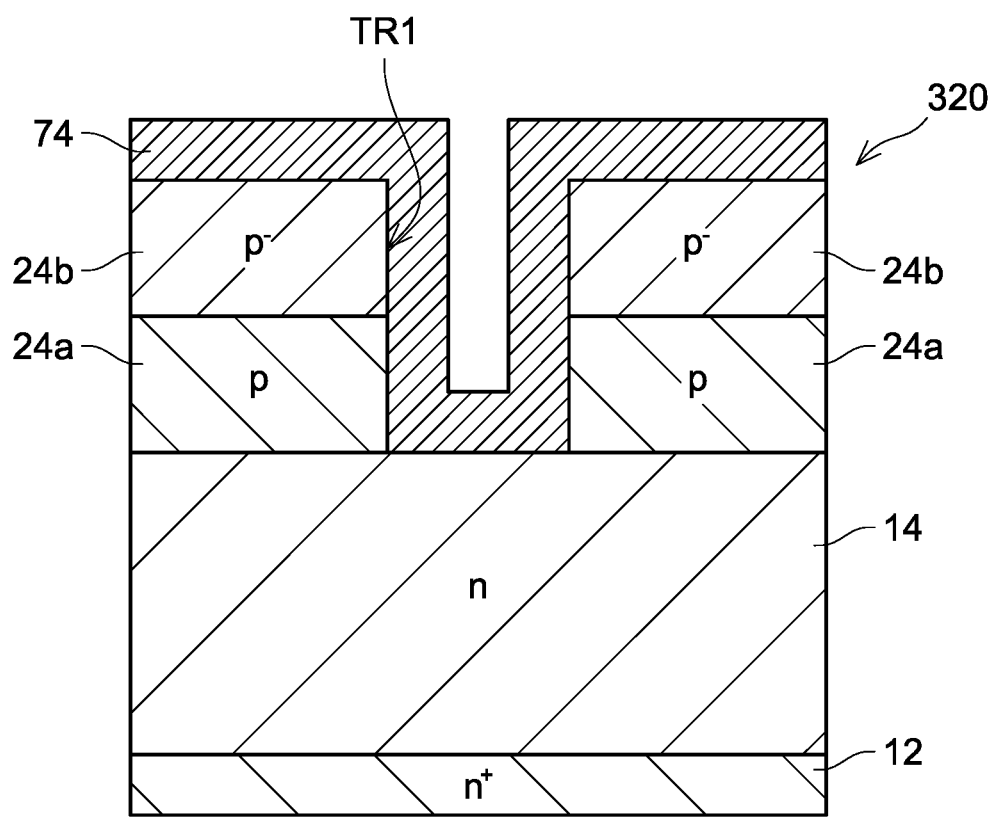
FIG. 8A schematically shows a cross sectional view of the main part of the semiconductor device of FIG. 7 in a manufacturing process.

Next, a method of manufacturing the semiconductor device 5 will be described. Firstly, as shown in FIG. 8A, steps up to forming the trench TR1 in a first nitride semiconductor layer 320 are same as those of FIGS. 2A and 2B. Next, a silicon oxide film 74 is formed on an inner surface of the trench TR1 by using vapor deposition technique. The silicon oxide film 74 is an example of a sacrificial layer.

Figure 8B:
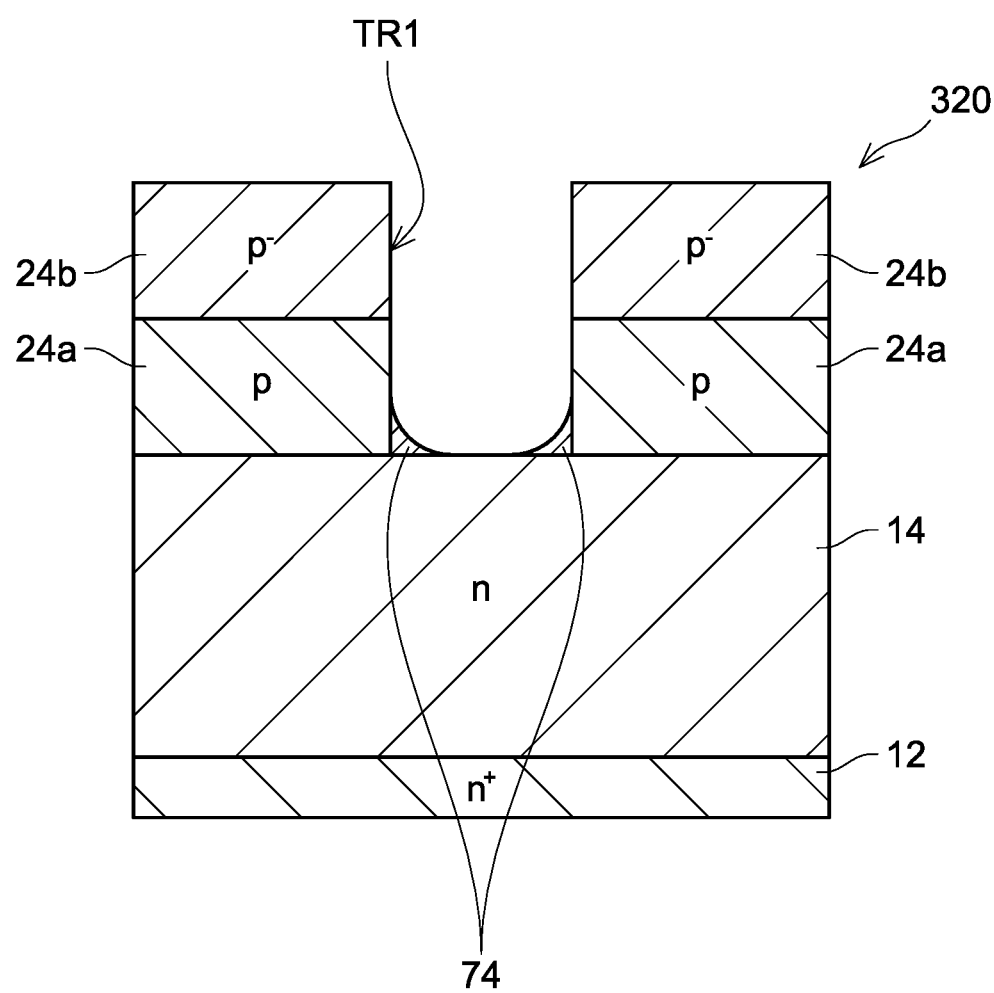
FIG. 8B schematically shows the cross sectional view of the main part of the semiconductor device of FIG. 7 in a manufacturing process.

Next, as shown in FIG. 8B, the silicon oxide film 74 is removed by using buffered hydrofluoric acid. At this occasion, parts of the silicon oxide film 74 are selectively left to remain at corners between side surfaces and a bottom surface of the trench TR1. Since wet etching technique is used, surfaces of the remaining parts of the silicon oxide film 74 are curved in a concave shape. In this process, portions where the silicon oxide film 74 does not exist, that is, surfaces of the n-type nitride semiconductor layer 14, the high concentration body region 24a, and the low concentration body region 24b, are surely exposed.

Figure 8C:
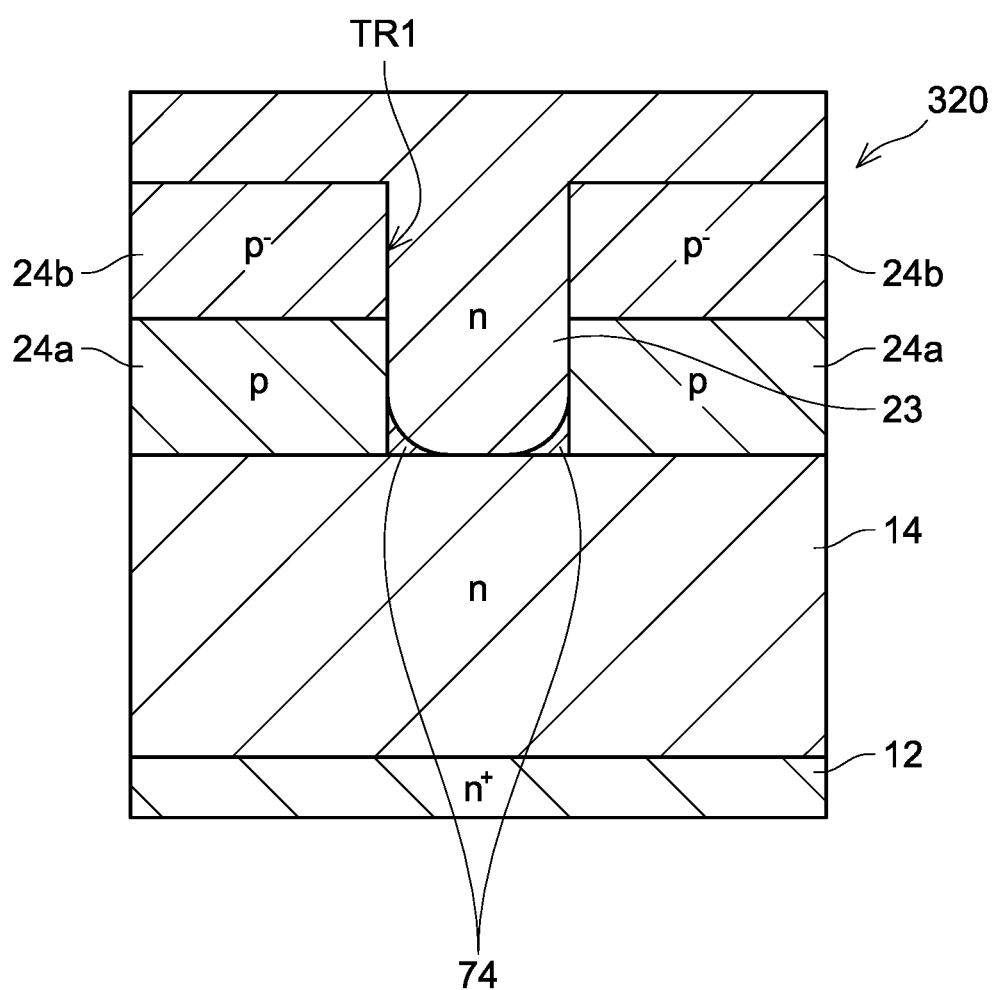
FIG. 8C schematically shows the cross sectional view of the main part of the semiconductor device of FIG. 7 in a manufacturing process.

Next, as shown in FIG. 8C, the JFET region 23 of n-type GaN is formed by using epitaxial growth technique so as to fill the trench TR1. The JFET region 23 has an impurity concentration of about $2\times10^{16}$ cm$^{-3}$.

Figure 8D:
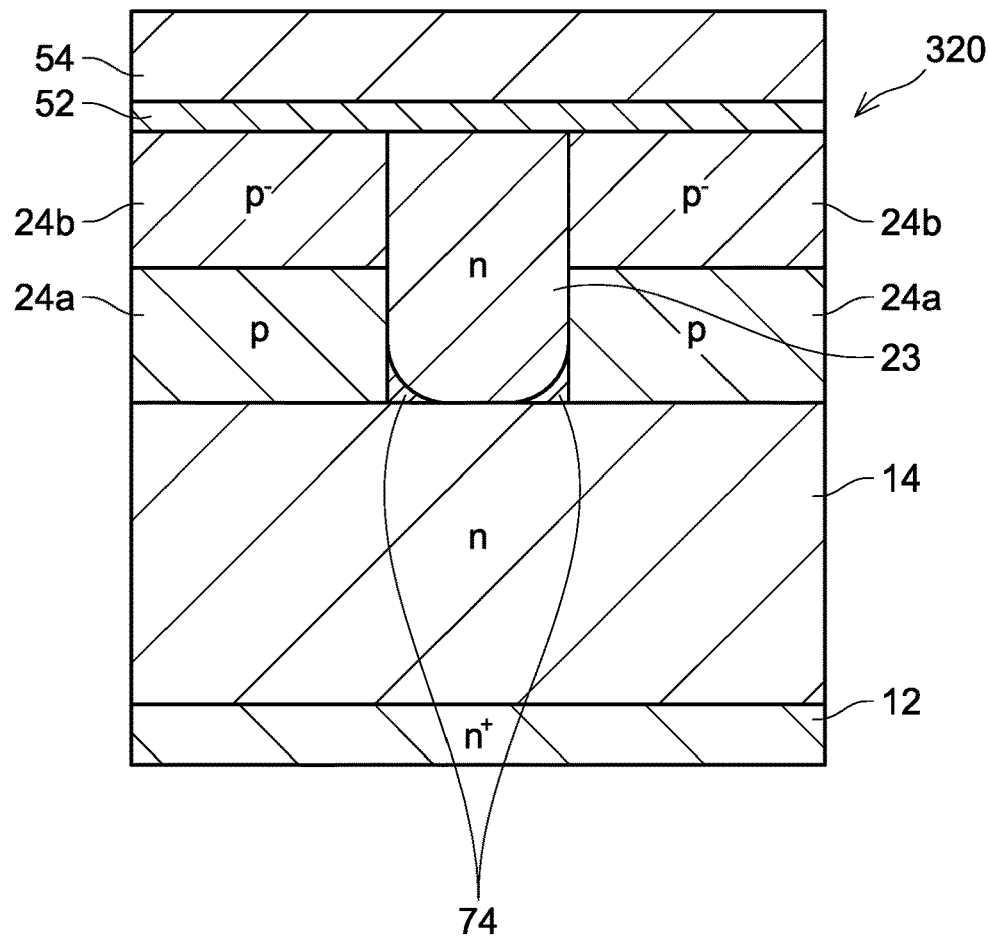
FIG. 8D schematically shows the cross sectional view of the main part of the semiconductor device of FIG. 7 in a manufacturing process.

Next, as shown in FIG. 8D, the JFET region 23 formed on the front surface of the low concentration body region 24b is removed and the front surfaces of the JFET region 23 and the low concentration body region 24b are planarized by using CMP technique, and thereafter the silicon support substrate 54 is adhered to a front surface of the first nitride semiconductor layer 320 via the silicon oxide film 52.

Figure 8E:
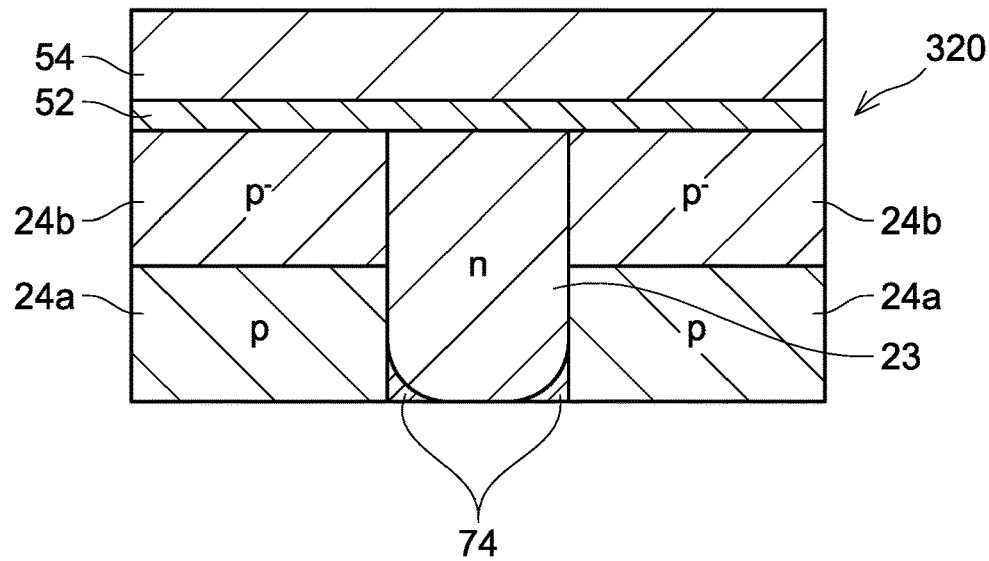
FIG. 8E schematically shows the cross sectional view of the main part of the semiconductor device of FIG. 7 in a manufacturing process.

Next, as shown in FIG. 8E, the nitride semiconductor substrate 12 and the n-type nitride semiconductor layer 14 are polished from a rear surface of the first nitride semiconductor layer 320 by using CMP technique such that the JFET region 23, the high concentration body region 24a, and the remaining parts of the silicon oxide film 74 are exposed.

Figure 8F:
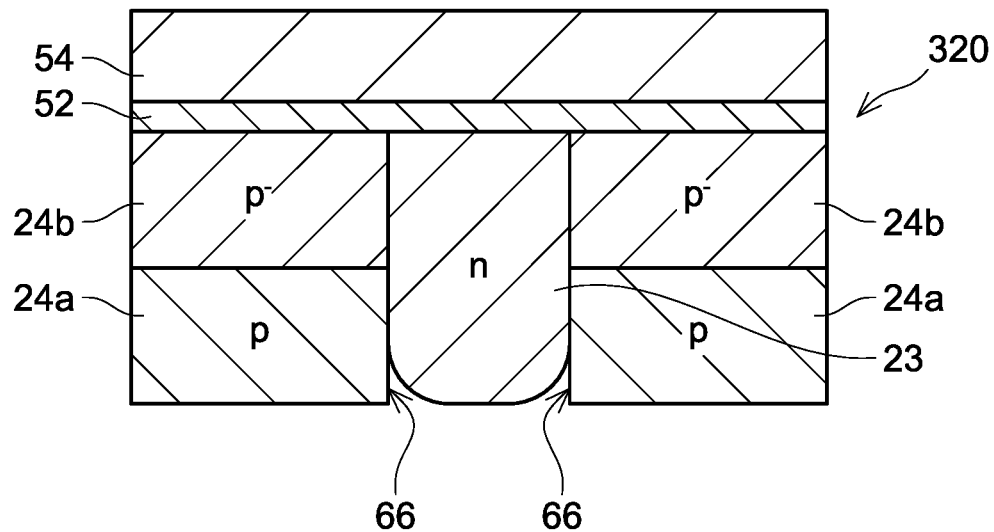
FIG. 8F schematically shows the cross sectional view of the main part of the semiconductor device of FIG. 7 in a manufacturing process.

Next, as shown in FIG. 8F, the remaining parts of the silicon oxide film 74 are removed by using buffered hydrofluoric acid to form recesses 66. Inner surfaces of the recesses 66 are defined by the JFET region 23 and the high concentration body region 24a. In other words, the JFET region 23 and the high concentration body region 24a are exposed to the recesses 66. Further, surfaces of the JFET region 23 exposed to the recesses 66 are curved surfaces projecting toward the recesses 66.

Figure 8G:
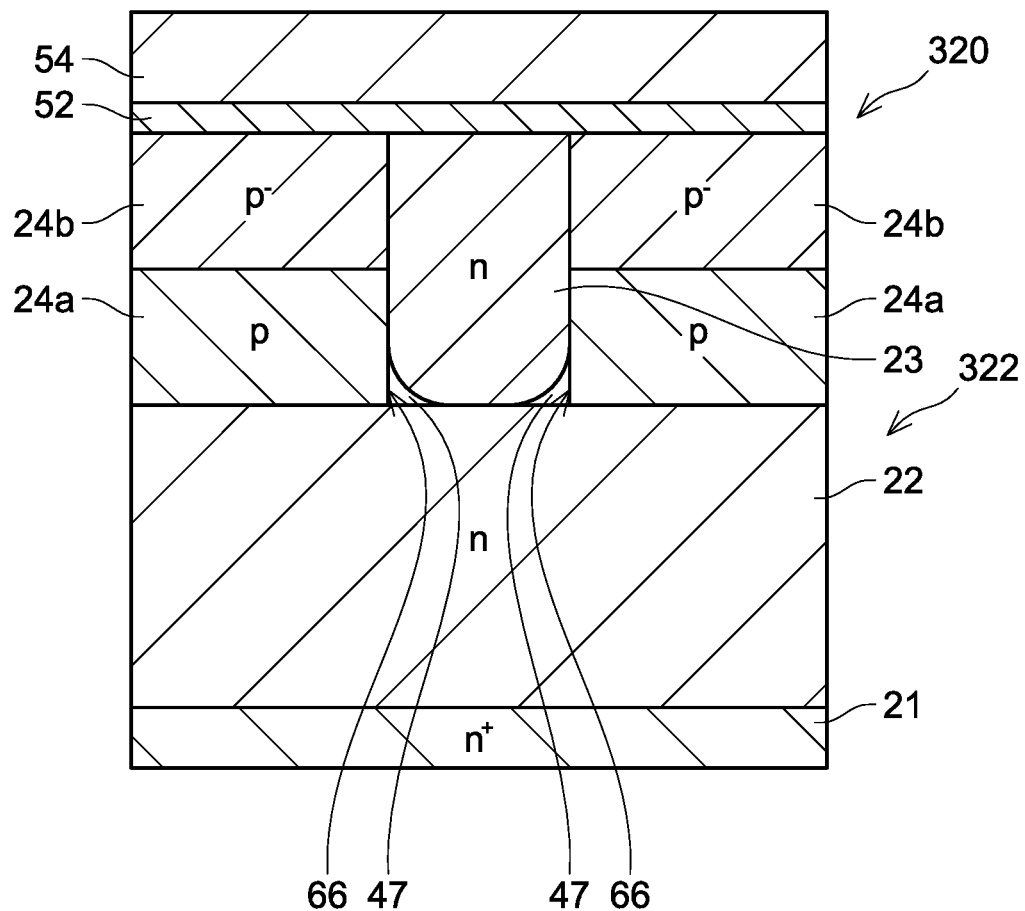
FIG. 8G schematically shows the cross sectional view of the main part of the semiconductor device of FIG. 7 in a manufacturing process.

Next, as shown in FIG. 8G, a second nitride semiconductor layer 322 in which the drain region 21 and the drift region 22 are layered is provided. Here, the drain region 21 has a thickness of about 400 µm and an impurity concentration of about $1\times10^{18}$ cm$^{-3}$. The drift region 22 has a thickness of about 5.0 µm and an impurity concentration of about $2\times10^{16}$ cm$^{-3}$. The second nitride semiconductor layer 322 is formed by providing the drain region 21 as a nitride semiconductor substrate and epitaxially growing the drift region 22 from a front surface of the drain region 21. As needed, a buffer layer of n-type GaN having a thickness of about 0.2 µm and an impurity concentration of about $3\times10^{18}$ cm$^{-3}$ may be provided between the drain region 21 and the drift region 22. Next, a front surface (surface on the drift region 22 side) of the second nitride semiconductor layer 322 is bonded to the rear surface of the first nitride semiconductor layer 320 while maintaining the recesses 66 in the vacuum state (while maintaining the high vacuum state). As the bonding technique here, the direct bonding method or the surface activated bonding method may be used. As above, the spaces 47, to which the drift region 22, the JFET region 23, and the high concentration body region 24a are exposed, are formed.

Figure 8H:
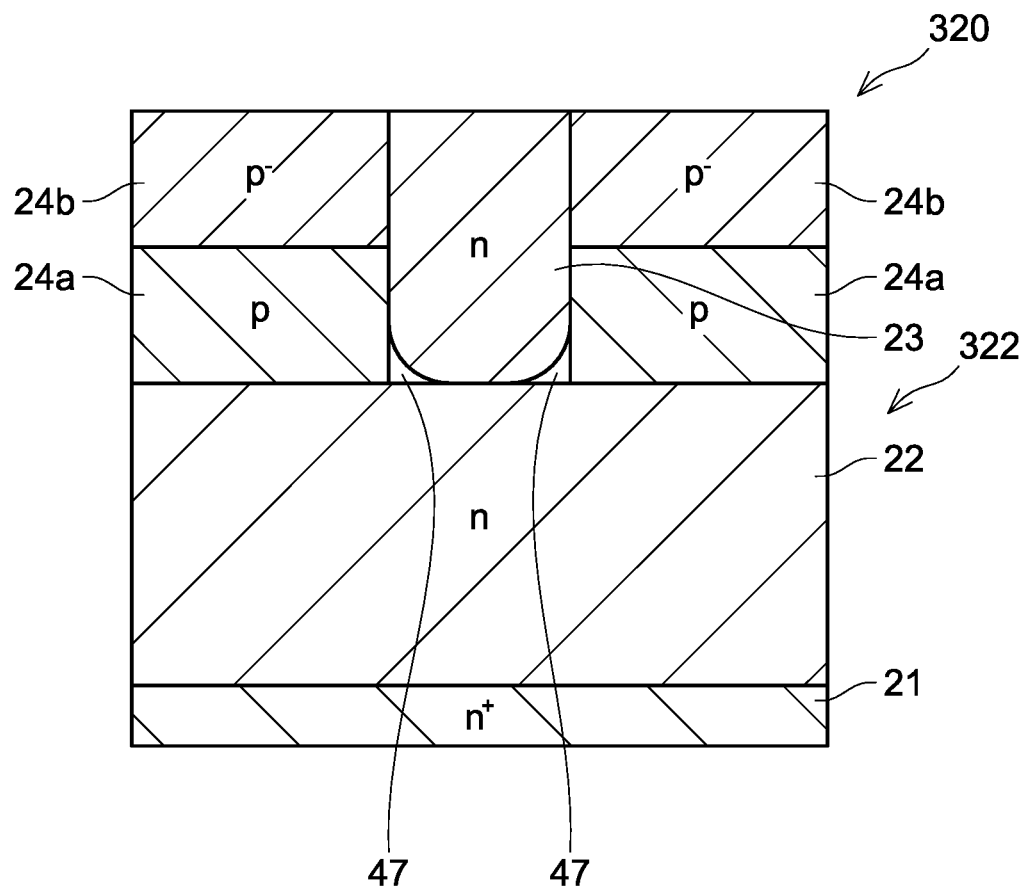
FIG. 8H schematically shows the cross sectional view of the main part of the semiconductor device of FIG. 7 in a manufacturing process.

Next, as shown in FIG. 8H, the silicon oxide film 52 is dissolved by using buffered hydrofluoric acid to lift off the silicon support substrate 54.

Figure 8I:
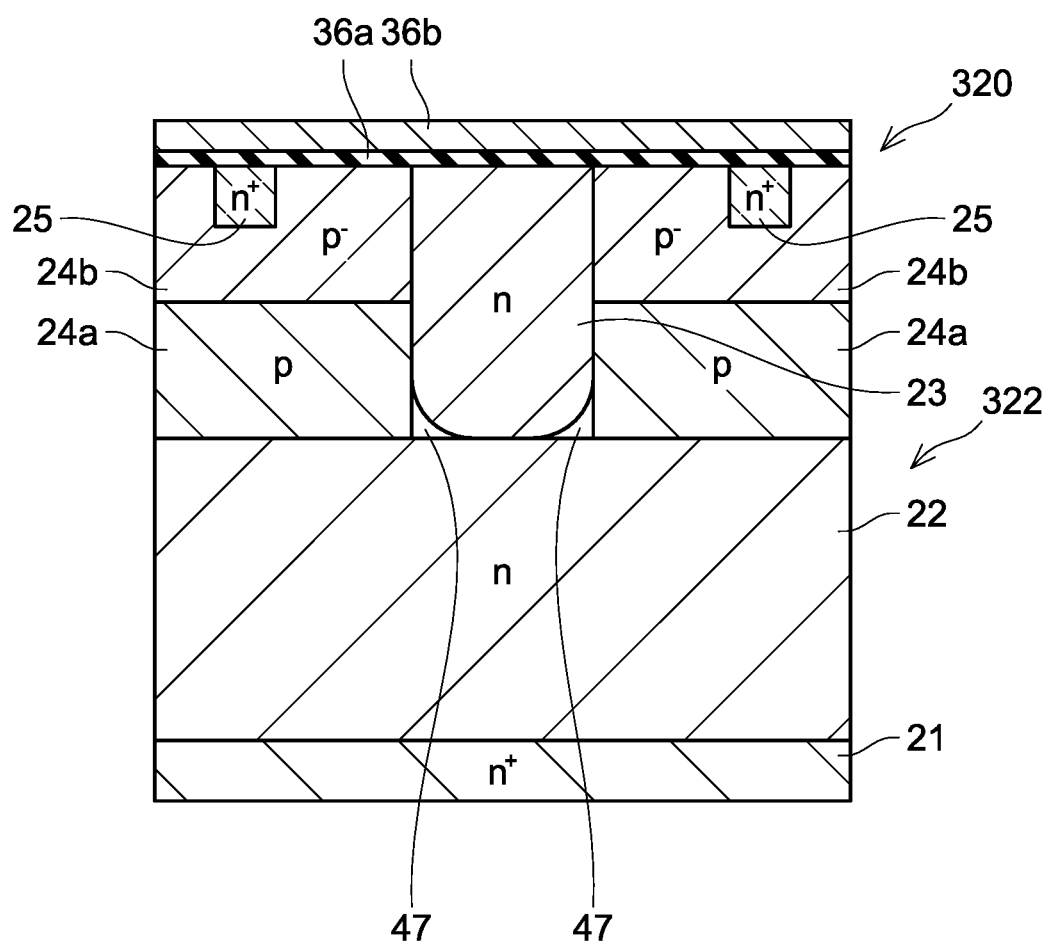
FIG. 8I schematically shows the cross sectional view of the main part of the semiconductor device of FIG. 7 in a manufacturing process.

Next, as shown in FIG. 8I, the source regions 25 are formed at parts of the front surface of the low concentration body region 24b by using ion injection technique and annealing technique. Silicon is used as a dopant, and a dose thereof is about $3 \times 10^{15}$ cm$^{-2}$. An annealing condition is at about 1000° C. for about 20 minutes. Next, by using vapor deposition technique, the gate insulation film 36a is formed on the front surface of the first nitride semiconductor layer 320, and thereafter the gate electrode 36b is formed on a front surface of the gate insulation film 36a.

Figure 8J:
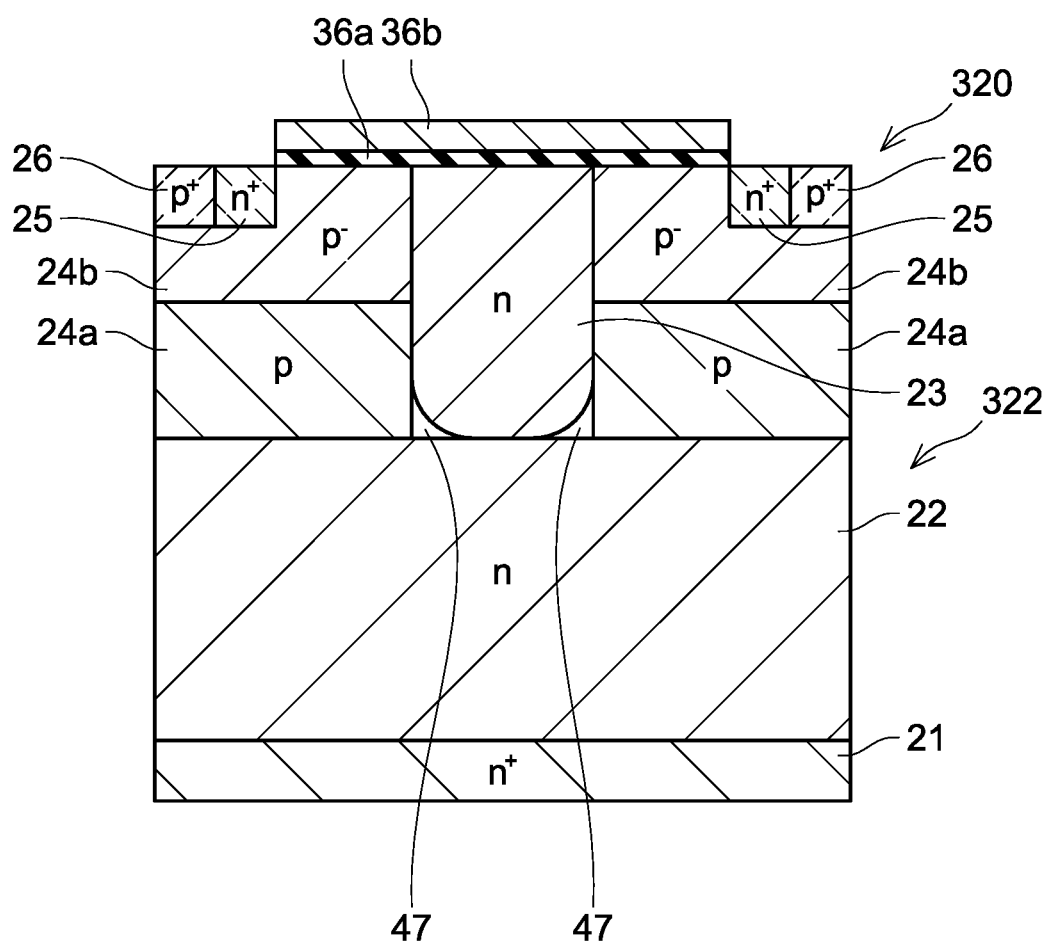
FIG. 8J schematically shows the cross sectional view of the main part of the semiconductor device of FIG. 7 in a manufacturing process.

Next, as shown in FIG. 8J, after the gate insulation film 36a and the gate electrode 36b have been processed, the body contact regions 26 are formed at parts of the front surface of the low concentration body region 24b. After this, the drain electrode and the source electrode are formed by using known manufacturing technique, which completes the semiconductor device 5 shown in FIG. 7.

Some of the features characteristic to the above-described embodiments will herein be listed. It should be noted that the respective technical elements are independent of one another, and are useful solely or in combinations. The combinations thereof are not limited to those described in the claims as originally filed.

A semiconductor device disclosed herein may comprise a semiconductor layer; a source electrode disposed above one main surface of the semiconductor layer, a drain electrode disposed below another main surface of the semiconductor layer; and an insulation gate section. No limitation is placed on the material of the semiconductor layer. As an example, the material of the semiconductor layer may be a nitride semiconductor. The semiconductor layer may comprise a drift region of a first conductivity type; a JFET region of the first conductivity type disposed above the drift region; a body region of a second conductivity type disposed above the drift region and adjoining the JFET region; and a source region of the first conductivity type separated from the JFET region by the body region. The insulation gate section may be opposed to a portion of the body region that separates the JFET region and the source region. A space may be provided within the semiconductor layer. The drift region, the JFET region and the body region may be exposed to the space.

As viewed in a direction orthogonal to the one main surface of the semiconductor layer, the space may be located within an area where the body region exists. In this case, a surface of the body region that is exposed to the space may be a curved surface projecting toward the space.

As viewed in a direction orthogonal to the one main surface of the semiconductor layer, the space may be located within an area where the JFET region exists. In this case, a surface of the JFET region that is exposed to the space may be a curved surface projecting toward the space.

A manufacturing method of a semiconductor device disclosed herein may comprise providing a first semiconductor layer, wherein a JFET region of a first conductivity type and a body region of a second conductivity type adjoin at one main surface side of the first semiconductor layer; removing a part of the first semiconductor layer from another main surface side of the first semiconductor layer such that the JFET region and the body region are exposed; forming a recess in a surface that has appeared by removing the part of the first semiconductor layer, wherein the JFET region and the body region are exposed to the recess; and providing a space by forming a drift region of the first conductivity type to cover the recess, wherein the drift region, the JFET region and the body region are exposed to the space. No limitation is placed on the material of the first semiconductor layer. As an example, the material of the first semiconductor layer may be a nitride semiconductor.

The providing of the first semiconductor layer may comprise forming a trench which penetrates a part of the JFET region from one main surface of the first semiconductor layer; forming a sacrificial layer to cover an inner surface of the trench; removing the sacrificial layer such that a part of the sacrificial layer remains at a corner between a side surface and a bottom surface of the trench; and forming the body region to fill the trench while the part of the sacrificial layer remains. In this case, the forming of the recess may comprise removing the remaining part of the sacrificial layer.

The providing of the first semiconductor layer may comprise forming a trench which penetrates a part of the body region from one main surface of the first semiconductor layer; forming a sacrificial layer to cover an inner surface of the trench; removing the sacrificial layer such that a part of the sacrificial layer remains at a corner between a side surface and a bottom surface of the trench; and forming the JFET region to fill the trench while the part of the sacrificial layer remains. In this case, the forming of the recess may comprise removing the remaining part of the sacrificial layer.

The forming of the space may comprise bonding a second semiconductor layer including the drift region to the first semiconductor layer. No limitation is placed on the material of the second semiconductor layer. As an example, the material of the second semiconductor layer may be a nitride semiconductor.

Specific examples of the present disclosure have been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

What is claimed is:
1. A semiconductor device comprising:
a semiconductor layer;
a source electrode disposed above one main surface of the semiconductor layer;
a drain electrode disposed below another main surface of the semiconductor layer; and
an insulation gate section, wherein
the semiconductor layer comprises:
   a drift region of a first conductivity type;
   a JFET region of the first conductivity type disposed above the drift region;
   a body region of a second conductivity type disposed above the drift region and adjoining the JFET region; and
   a source region of the first conductivity type separated from the JFET region by the body region,
the insulation gate section is opposed to a portion of the body region that separates the JFET region and the source region, an empty space is provided within the semiconductor layer, and the drift region, the JFET region and the body region are exposed to the empty space.

2. The semiconductor device of claim 1, wherein as viewed in a direction orthogonal to the one main surface of the semiconductor layer, the empty space is located within an area where the body region exists.

3. The semiconductor device of claim 2, wherein a surface of the body region that is exposed to the empty space is a curved surface projecting toward the empty space.

4. The semiconductor device of claim 1, wherein as viewed in a direction orthogonal to the one main surface of the semiconductor layer, the empty space is located within an area where the JFET region exists.

5. The semiconductor device of claim 4, wherein a surface of the JFET region that is exposed to the empty space is a curved surface projecting toward the empty space.

6. The semiconductor device of claim 1, wherein a material of the semiconductor layer is a nitride semiconductor.

7. The semiconductor device of claim 1, wherein the empty space is configured to be in a vacuum state.

* * * * *